(12) United States Patent
Erez et al.

(10) Patent No.: US 7,340,359 B2
(45) Date of Patent: Mar. 4, 2008

(54) AUGMENTING SEMICONDUCTOR'S DEVICES QUALITY AND RELIABILITY

(75) Inventors: Nir Erez, Nes Zionna (IL); Gil Balog, Jerusalem (IL)

(73) Assignee: Optimaltest Ltd, Nes-Zionna (IL)

( * ) Notice: Subject to any disclaimer, the term of this patent is extended or adjusted under 35 U.S.C. 154(b) by 0 days.

(21) Appl. No.: 11/343,209

(22) Filed: Jan. 31, 2006

(65) Prior Publication Data
US 2006/0267577 A1    Nov. 30, 2006

Related U.S. Application Data

(60) Provisional application No. 60/676,289, filed on May 2, 2005.

(51) Int. Cl.
*G06F 19/00* (2006.01)
(52) U.S. Cl. .......................... 702/81; 702/82; 702/118; 700/109; 700/121
(58) Field of Classification Search .................. 702/81, 702/82
See application file for complete search history.

(56) References Cited

U.S. PATENT DOCUMENTS

| | | | |
|---|---|---|---|
| 5,210,041 A | 5/1993 | Kobayashi et al. ............. 478/7 |
| 5,726,920 A | 3/1998 | Chen et al. .................. 702/108 |
| 5,991,699 A * | 11/1999 | Kulkarni et al. ............... 702/83 |
| 6,140,832 A * | 10/2000 | Vu et al. ..................... 324/765 |
| 6,175,812 B1 * | 1/2001 | Boyington et al. .......... 702/118 |
| 6,184,048 B1 | 2/2001 | Ramon ......................... 438/14 |
| 6,230,293 B1 * | 5/2001 | Chittipeddi et al. ......... 714/724 |
| 6,351,681 B1 | 2/2002 | Chih et al. ................... 700/121 |
| 6,373,011 B1 | 4/2002 | Beffa .......................... 209/573 |
| 6,414,508 B1 * | 7/2002 | London ....................... 324/765 |
| 6,512,985 B1 | 1/2003 | Whitefield et al. ............ 702/81 |
| 6,549,027 B1 | 4/2003 | Mott ........................... 324/764 |
| 6,563,070 B2 | 5/2003 | Capser ....................... 209/573 |
| 6,618,682 B2 | 9/2003 | Bulaga et al. ................. 702/84 |
| 6,633,014 B2 | 10/2003 | Casper ....................... 209/573 |
| 6,675,362 B1 | 1/2004 | Ortiz et al. ..................... 716/4 |

(Continued)

OTHER PUBLICATIONS

Deming, W. Edwards, Out of the Crisis, Massachusetts Institute of Technology, Center for Advanced Engineering Study, Cambridge, Mass., pp. 169, Aug. 31, 1993.

(Continued)

*Primary Examiner*—Hal Wachsman
(74) *Attorney, Agent, or Firm*—The Nath Law Group; Jerald L. Meyer; Jonathan A. Kidney

(57) ABSTRACT

A method for augmenting quality or reliability of semiconductor units, including providing few populations of semiconductor units that are subject to quality or reliability testing. The populations include few quality or reliability fail candidate populations and other population(s). The method includes the step of associating test flows to the populations. Each test flow includes stress testing sequence. The stress testing sequence for the quality or reliability fail candidate population includes a stress test of increased duration compared to duration of a stress test in the test flow of the other population. The stress test sequence for the other population includes a stress test of increased voltage compared to corresponding operating voltage specification for a semiconductor unit. The method further includes the step of applying, within a sort testing stage, the corresponding test flow to the populations and identifying any unit which failed the stress sequence.

61 Claims, 15 Drawing Sheets

U.S. PATENT DOCUMENTS

| | | |
|---|---|---|
| 6,747,228 B2 | 6/2004 | Capser ........................ 209/571 |
| 6,779,140 B2 | 8/2004 | Krech, Jr. et al. ........... 714/718 |
| 6,885,950 B2 * | 4/2005 | Mitsutake et al. ............. 702/58 |
| 2002/0063085 A1 | 5/2002 | Capser ........................ 209/573 |
| 2002/0079252 A1 | 6/2002 | Capser ........................ 209/571 |
| 2002/0120457 A1 | 8/2002 | Oliveira et al. .............. 704/500 |
| 2003/0011376 A1 * | 1/2003 | Matsushita et al. .......... 324/500 |
| 2003/0097228 A1 * | 5/2003 | Satya et al. .................... 702/82 |
| 2003/0120445 A1 * | 6/2003 | Barbour et al. ................ 702/81 |
| 2003/0120457 A1 * | 6/2003 | Singh et al. ................. 702/181 |
| 2004/0088074 A1 | 5/2004 | Chen et al. .................. 700/223 |
| 2005/0174138 A1 * | 8/2005 | Marr .......................... 324/765 |
| 2005/0253617 A1 | 11/2005 | Roberts et al. .............. 324/765 |

OTHER PUBLICATIONS

Kececioglu, Dimitri B., Reliability Engineering Handbook, vol. 1, DEStech Publications, Inc., Lancaster, Pennsylvania, 2002, 2 pages, no month.

Reinholm, Jukka, "Quality" student paper submitted to Dr. Jerry Crigie on Jan. 16, 2001, 17 pages.

* cited by examiner

| Fab Skew Lot | Definition |
|---|---|
| "Poly" Target − 3 Sigma | Fast Material |
| "Poly" Target | Typical Material |
| "Poly" Target + 3 Sigma | Slow Material |

| Description | Wafer Test Program Flow | | | Wafer Yield | | | Burn-in Yield | |
|---|---|---|---|---|---|---|---|---|
| | Stress Duration | Stress Voltage | | Good Bins | Bad Bins | Bad Rel Bins | Good | Bad |
| Base-line Flow (Additional Voltage) | 50msec | +30% Vcc | | 75% | 22% | 3% | 95% | 5% |
| Additional Stress Voltage and Duration | 100msec | +40% Vcc | | 74% | 22% | 4% | 96% | 4% |
| Additional Stress Voltage and Duration | 100msec | +30% Vcc | | 74% | 22% | 4% | 96% | 4% |
| Additional Stress Voltage and Duration | 200msec | +30% Vcc | | 73% | 22% | 5% | 97% | 3% |
| Additional Stress Voltage and Duration | 200msec | +40% Vcc | | 72% | 22% | 6% | 99% | 1% |

AUGMENTING SEMICONDUCTOR'S DEVICES QUALITY AND RELIABILITY

This application claims the benefit of prior U.S. provisional patent application Ser. No. 60/676,289 filed on May 2, 2005, the contents of which are hereby incorporated by reference in their entirety.

FIELD OF THE INVENTION

This invention relates to a system and method for augmenting semiconductor integrated circuit quality or reliability through real-time testing.

BACKGROUND OF THE INVENTION

Testing has emerged as a key constraint in the push for more advanced, reliable and cost-effective semiconductor based products. Advances in semiconductor process technology have enabled chip designers to pack high volume production chips with 100 million transistors. Experts predict this will increase to more than 1 billion transistors within the next few years.

Semiconductor process technology is characterized by Moore's Law, which states that the numbers of transistors in a given surface area will double every 18 months. Much of this density increase is driven by smaller and smaller line widths or geometries. Today 90 nm devices are common and 25 nm designs are in development (a nanometer is one billionth of a meter or $\frac{1}{1200}$th width of human hair). These advances place a strain on test systems as more transistors and structures must be tested. This exponential growth rate also drives a continual increase in the process, design and manufacturing complexities which, in turn, can increase systemic problems that affect quality, yield and product reliability. All of these factors tend to drive the need for more test time and more comprehensive testing, thus test cost has become a major factor in the overall manufacturing cost of an integrated circuit.

Even with commodity and other products there is an ever-increasing demand by customers to push quality, yield and reliability to new levels. These factors have combined to put major stresses on conventional test capacity and systems. Current solutions to the problem are not cost-effective and rely on either adding expensive capital equipment or relaxing quality standards.

Quality is a known term in the semiconductor industry. One known definition of this term is "a product's nature or features that reflect capacity to satisfy express or implied statements of needs" (Deming, W. Edwards, Out of the Crisis, Cambridge, Mass. Aug. 31, 1993).

Reliability is a known term in the semiconductor industry. One known definition of this term is: "the conditional probability, at a given confidence level, that the equipment will perform its intended functions satisfactorily or without failure, i.e., within specified performance limits, at a given age, for a specified length of time, function period, or mission time, when used in the manner and for the purpose intended while operating under the specified application and operation environments with their associated stress levels" (Kececioglu, Dimitri, Reliability Engineering Handbook, Vol. 1, 2002). Note, incidentally, that these definitions are provided for clarity only and, accordingly, the use of the terms "quality" and/or "reliability" in the context of the invention is by no means bound by these definitions.

Currently, testing is performed by two basic methods. Either, devices are tested one at a time, in singular manner (sequentially); or, several are tested at the same time in "parallel". Singular tests are more common with complex products such as CPUs while memory devices are most often tested in parallel. Note, however, that these examples are not binding.

As is well known, there are various manufacturing stages including "sort" which aims at testing the semiconductor devices at wafer level and a later final stage which aims at testing the semiconductor devices after having been packaged.

The main goal of the specified stages is to separate out potentially good devices from those that fail testing.

Each of the specified phases is traditionally divided into a few sockets, such as sort1, sort2 etc. Each test socket is applied to the same product (e.g. to all manufactured lots of wafers of the particular product) in a slightly different test flow. For instance, for a given socket, a set of tests is performed at a given temperature, whereas for another socket, the same (or similar) tests are performed at a different temperature. By way of another example, functional tests are applied to the first socket and structural tests are applied to the second socket.

By the same token, the final test phase is divided into distinct stages, such as final1, final2, etc.

As is well known, a semiconductor device is always designed at the single device level. The resulting single prototype is then replicated again and again in the semiconductor fabrication process using lithography or other equipment across the surface of a silicon wafer.

Design for Testability (DFT) is the process in which the device designers create various tests such as functional tests that include the correct patterns and vectors that are used to test the device according to its expected functionality, or creation of parametric tests, etc. A test flow may include functional tests, parametric tests and/or other tests, (whichever the case may be) that are used in the testing process.

Test Program (TP) is composed of test flows that are applied across all the devices on a product in a nearly identical manner. The TP is product specific.

Typically, at a given socket (during sort stage) 100% of all dice are put through the requisite tests and undergo the entire TP (100% TP). In other words, all dice will be subjected to the same test flow, such as continuity, opens, shorts, various functional tests, stuck at scan, at-speed scan, leakage, icc, iddq and/or many more—depending upon various parameters such as the device type.

There are several inherent limitations of the specified testing methodologies, for instance: final IC product reliability can be increased by applying additional tests and stresses, however, since the test program is identically applied over the entire wafer, such a methodology will affect the whole product and thus dramatically increase overall test cost.

Product reliability is a key customer satisfaction issue and affects the reputation of the manufacturer.

Bearing this in mind there follows a list of publications which may be regarded as related art:

U.S. Pat. No. 6,184,048 discloses: A method for assuring quality and reliability of semiconductor integrated circuit devices, fabricated by a series of documented process steps, comprising first, electrically testing the devices outside their specified operating voltage range, yet within the capabilities of the structures produced by the process steps, thereby generating raw electrical test data; second, comparing the test data to values expected from the design of the devices, thereby providing non-electrical characterization of the devices to verify compositional and structural features; and third, correlating the features with the documented process steps to find deviations therefrom, as well as structural defects, thereby identifying outlier devices. After eliminating the outlier devices, the accepted devices do no longer have to undergo the traditional burn-in process.

U.S. Pat. No. 6,618,682 discloses: A method and system are provided that minimize wafer or package level test time without adversely impacting yields in downstream manufacturing processes or degrading outgoing quality levels. The method provides optimization by determining, a priori, the most effective set of tests for a given lot or wafer. The invention implements a method using a processor-based system involving the integration of multiple sources of data that include: historical and real-time, product specific and lot specific, from wafer fabrication data (i.e., process measurements, defect inspections, and parametric testing), product qualification test results, physical failure analysis results and manufacturing functional test results. These various forms of data are used to determine an optimal set of tests to run using a test application sequence, on a given product to optimize test time with minimum risk to yield or product quality.

US 2003/0120457 discloses: A system and method for determining the early life reliability of an electronic component, including classifying the electronic component based on an initial determination of a number of fatal defects, and estimating a probability of latent defects present in the electronic component based on that classification with the aim of optimizing test costs and product quality.

There is a need in the art for a new system and method for augmenting semiconductor integrated circuit quality or reliability through real-time optimal testing. Moreover, there is a need in the art to provide a system and method for applying selectively different test flows to different semiconductor units. The different test flows may apply, for example, to different populations in a wafer or in accordance with another example, to different wafers in a lot. The different populations may be for example different geographies and/or different lithography exposures. The unit may be a whole die or module(s) within a semiconductor device (die). The different test flows may be applied e.g. during sort testing stage and/or during final testing stage.

SUMMARY OF THE INVENTION

In accordance with certain embodiments of the invention, reliability augmentation is a method that utilizes e.g. IC product characteristics, product fabrication process and test data knowledge to optimize device test and stress flows resulting in a more reliable product. Typically, the more reliable the product, the lower the Defective Parts per Million (DPPM) score.

In accordance with certain embodiments of the invention, there is provided a method and system that provide augmentation of semiconductor units (device or module(s) thereof) quality or reliability by determining the set of reliability tests applied e.g. to a specific IC lot, wafer, areas of a wafer, wafer die, dice within the same lithography exposure, dice with the same location across lithography exposures, packaged device or (functional) modules within an IC.

In accordance with certain embodiments, there is provided a data manager, station controller, database and software. The station controller integrates information provided from the data manager. The latter gathers historic information from various sources and analyses this for identifying the relevant population(s) of semiconductor units which are candidate to fail quality or reliability tests and associating thereto appropriate test flow(s) including stress tests. The test flow(s) are handled at the station controller and are applied to the specified populations through the product's test program and will augment the product's reliability as compared to the original product expected quality or reliability.

There is provided a method for augmenting quality or reliability of semiconductor units, comprising:

(a) providing at least two populations of semiconductor units that are subject to quality or reliability testing; the at least two populations including at least one quality or reliability fail candidate population and at least one other population;

(b) associating test flows to the at least two populations; each test flow including a stress testing sequence; wherein the stress testing sequence for at least one of the quality or reliability fail candidate populations includes a stress test of increased duration as compared to a duration of a stress test in a test flow of at least one of the other populations; wherein the stress testing sequence for at least one of the other populations includes a stress test of increased voltage as compared to a corresponding operating voltage specification for a semiconductor unit of the semiconductor units; and (c) applying, within a sort testing stage, a corresponding test flow to each of the at least two populations and identifying any semiconductor unit which failed the stress testing sequence.

There is also provided a method for augmenting quality or reliability of semiconductor units, comprising:

(a) providing at least two populations of semiconductor units that are subject to quality or reliability testing;

(b) associating test flows that include stress testing sequences to the at least two populations; a first flow from the test flows further including an identical first pre-stress testing sequence and first post-stress testing sequence; a second flow from the test flows further including an identical second pre-stress testing sequence and a second post-stress testing sequence; the first and the second stress testing sequences being different; and (c) applying, within a sort testing stage: the test flow that included the first pre-stress testing sequence, the stress testing sequence, and the first post-stress testing sequence, to at least one of the at least two populations; and the test flow that included the second pre-stress testing sequence, the stress testing sequence, and the second post-stress testing sequence, to at least one other of the at least two populations; for identifying any semiconductor unit which failed the first or second post-stress testing sequence.

The invention further provides a method for augmenting quality or reliability of semiconductor units, comprising:

(a) providing at least two populations of semiconductor units that are subject to quality or reliability testing; the at least two populations including at least one quality or reliability fail candidate population and at least one other population;

(b) associating test flows to the at least two populations; each test flow including a stress testing sequence; the stress testing sequence for at least one of the quality or reliability fail candidate populations including a stress test of increased duration as compared to a duration of a stress test in a test flow of a population of at least one of the other populations; wherein the stress testing sequence for at least one of the other populations includes a stress test of increased voltage as compared to a corresponding operating voltage specification for the semiconductor unit;

(c) applying, within a final testing stage, a corresponding test flow to each of the at least two populations and identifying any semiconductor unit which failed the stress testing sequence.

The invention further provides a method a for providing augmented quality or reliability tests configured to be applied to semiconductor units, comprising:

(a) analyzing data gathered from historical information that pertains to semiconductor units for identifying at least two populations of semiconductor units that are subject to quality or reliability testing; the at least two populations including at least one quality or reliability fail candidate population and at least one other population;

wherein at least one of the quality or reliability fail candidate populations includes a geographical area in a wafer that includes a cluster of at least two consecutive devices, such that any device in the cluster has at least one neighboring device which also belongs to the cluster; and (b) providing at least two different test flows and associating at least one of the at least two different test flows to one of the quality or reliability fail candidate populations, and at least one other test flow of the at least test flows to at least one of the other population; wherein the at least two different test flows are configured to be applied, within a testing stage, to the associated populations, for identifying a semiconductor unit which has failed the test.

The invention further provides a method for providing augmented quality or reliability tests configured to be applied to semiconductor units, comprising:

(a) analyzing data gathered from historical information that pertain to semiconductor units for identifying at least two populations of semiconductor units that are subject to quality or reliability testing;

the at least two populations including at least one quality or reliability fail candidate population and at least one other population;

at least one of the quality or reliability fail candidate populations including semiconductor units with the same lithography exposure; and (b) providing at least two different test flows and associating at least one of the at least two different test flows to one of the quality or reliability fail candidate populations, and at least one other test flow of the at least test flows to at least one of the other population; wherein the at least two different test flows are configured to be applied, within a testing stage, to the associated populations, for identifying a semiconductor unit which has failed the test. The invention further provides a method for providing augmented quality or reliability tests configured to be applied to semiconductor units, comprising:

(a) analyzing data gathered from historical information that pertain to semiconductor units for identifying at least two populations of semiconductor units that are subject to quality or reliability testing;

the at least two populations including at least one quality or reliability fail candidate population and at least one other population;

at least one of the quality or reliability fail candidate populations including semiconductor units with a same relative location across lithography exposures; and (b) providing at least two different test flows and associating at least one of the at least two different test flows to at least one of the quality or reliability fail candidate populations, and associating at least one of an other different test flow to at least one of the other populations, the at least two different test flows being configured to be applied, within a testing stage, to associated populations for identifying a failed semiconductor unit.

The invention further provides a method for providing augmented quality or reliability tests configured to be applied to semiconductor units during a manufacturing stage, comprising:

(a) analyzing data gathered from historical information that pertains to semiconductor units for identifying at least two populations of semiconductor units that are subject to quality or reliability testing; the at least two populations including at least one quality or reliability fail candidate population and at least one other population;

(b) providing a repertoire of test flows;

(c) for at least one of the quality or reliability fail candidate populations performing the following, including:

i) providing a reference burn-in units fail score in respect to the quality or reliability fail candidate population of a semiconductor sample;

ii) selecting a test flow from the repertoire of test flows;

iii) applying the selected test flow to the semiconductor sample of the quality or reliability fail candidate population and logging the tested unit's-fail score; the semiconductor sample being substantially identical to the semiconductor sample of (c) and (i);

iv) applying a burn-in test to the quality or reliability fail candidate population of the semiconductor sample of (iii) and logging the tested burn-in units fail score; wherein units having failed in the tested units fail score are excluded from the burn-in units fail score;

v) repeating at least once (ii) to (iv), in respect to different test flow from the repertoire of test flows;

vi) determining a prevailing test flow from among the test flows used in (ii), (iii) and (iv), according to a decision criterion; wherein the decision criterion is dependent at least on the reference burn-in units fail score, and the tested units fail score and tested burn-in units fail score of the prevailing test flow; and associating the prevailing test flow to the quality or reliability fail candidate population, for applying to semiconductor units during a manufacturing stage.

The invention further provides a method for providing augmented quality or reliability tests configured to be applied to semiconductor units during sort stage, comprising:

(a) analyzing data gathered from historical information that pertains to semiconductor units for identifying at least one population of semiconductor units that is subject to quality or reliability testing;

(b) associating a respective selected test flow to each one of the at least one population according to a decision criterion that includes a condition that a fail rate of units in a burn-in test that follows the selected test flow is lower than a fail rate of units in a burn-in test that follows a non-selected test flow.

The invention further provides a system for augmenting quality or reliability of semiconductor units, comprising:

means including a processor and storage configured to provide at least two populations of semiconductor units that are subject to quality or reliability testing; the at least two populations including at least one quality or reliability fail candidate population and at least one other population;

means including a processor and storage configured to associate test flows to the at least two populations; each test flow including a stress testing sequence;

wherein the stress testing sequence for at least one of the quality or reliability fail candidate populations includes a stress test of increased duration as compared to a duration of a stress test in the test flow of at least one of the other populations;

wherein the stress testing sequence for at least one of the other populations includes a stress test of increased voltage as compared to a corresponding operating voltage specification for a semiconductor unit of the semiconductor units; and means configured to apply, within a testing stage, the corresponding test flow to each population and identifying any semiconductor unit which failed the stress testing sequence.

The invention further includes a system for augmenting quality or reliability of semiconductor units, comprising:

means including a processor and storage configured to provide at least two populations of semiconductor units that are subject to quality or reliability testing;

means including a processor and storage configured to associate test flows that include stress testing sequences to the at least two populations; a first test flow from among the test flows further including an identical first pre-stress testing sequence and first post-stress testing sequence; a second test flow from the test flows further including an identical second pre-stress testing sequence and second post-stress testing sequence;

wherein the first and second stress testing sequences are different; and means configured to apply, within a testing stage, a test flow that includes the first pre-stress testing sequence, the first stress testing sequence and the first post-stress testing sequence, and a test flow that includes the second pre-stress testing sequence, the second stress testing sequence and the second post-stress testing sequence, to at least one of the at least two populations for identifying any semiconductor unit which failed the first or second post-stress testing sequence.

The invention further includes a computer program product containing a computer readable medium having instructions encoded therein for operation of a computing device, comprising:

instructions for performing at least one of storing or reading storage data indicative of at least two populations of semiconductor units that are subject to quality or reliability testing, wherein the at least two populations include at least one quality or reliability fail candidate population and at least one other population;

instructions for performing at least one of storing or reading test flow information associated with the at least two populations of semiconductor units, wherein the test flow information contains a stress testing sequence, wherein the test stressing sequence for at least one of the quality or reliability fail candidate populations includes a stress test of increased duration as compared to a duration of a stress test in one of the other populations, the stress testing sequence for at least one of the other population including a stress test of increased voltage as compared to a corresponding operating voltage specification for a semiconductor unit of the semiconductor units; and instructions for applying within a testing stage, an association of a corresponding test flow to each of the at least two populations, to enable an identification of a failing semiconductor unit.

The invention further includes a computer program product containing a computer readable medium having instructions encoded therein for operation of a computing device, comprising:

instructions for performing at least one of storing or reading storage data indicative of at least two populations of semiconductor units that are subject to quality or reliability testing, wherein the at least two populations include at least one quality or reliability fail candidate population and at least one other population;

instructions for performing at least one of storing or reading test flow data associated with the at least two populations of semiconductor units, wherein the test flow data includes stress test sequences to the at least two populations, wherein a first test flow from the test flow data includes an identical first pre-stress test sequence and a first post-stress test sequence, and a second test flow from the test flow data includes a second pre-stress test sequence and a second post-stress test sequence, the sequences of the first and second test flow data being different; and instructions to apply, within a testing stage, test flow that include a pre-stress test sequence, an associated stress test sequence, and a post-stress test sequence to at least one of an associated population, to enable an identification of a semiconductor unit that failed the post-stress test sequence.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIGS. 10A-10B illustrate two tables for further exemplifying the flow chart sequence of FIG. 9;

DETAILED DESCRIPTION OF EXEMPLARY EMBODIMENTS

The present invention is primarily disclosed as a method and it will be understood by a person of ordinary skill in the art that an apparatus such as a conventional data processor incorporated with a database, software and other appropriate components could be programmed or otherwise designed to facilitate the practice of the method of the invention.

Unless specifically stated otherwise, as apparent from the following discussions, it is appreciated that throughout the specification discussions, utilizing terms such as, "processing", "computing", "calculating", "determining", "applying", "associating", "providing" or the like, refer to the action and/or processes of a computer or computing system, or processor or similar electronic computing device, that manipulate and/or transform data represented as physical, such as electronic, quantities within the computing system's registers and/or memories into other data, similarly represented as physical quantities within the computing system's memories, registers or other such information storage, transmission or display devices.

Embodiments of the present invention may use terms such as, processor, computer, apparatus, system, sub-system, module, unit, device (in single or plural form) for performing the operations herein. This may be specially constructed for the desired purposes, or it may comprise a general purpose computer selectively activated or reconfigured by a computer program stored in the computer. Such a computer program may be stored in a computer readable storage medium, such as, but not limited to, any type of disk including optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, any other type of media suitable for storing electronic instructions that are capable of being conveyed via a computer system bus.

The processes/devices (or counterpart terms specified above) and displays presented herein are not inherently related to any particular computer or other apparatus, unless specifically stated otherwise. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Figure 1A:
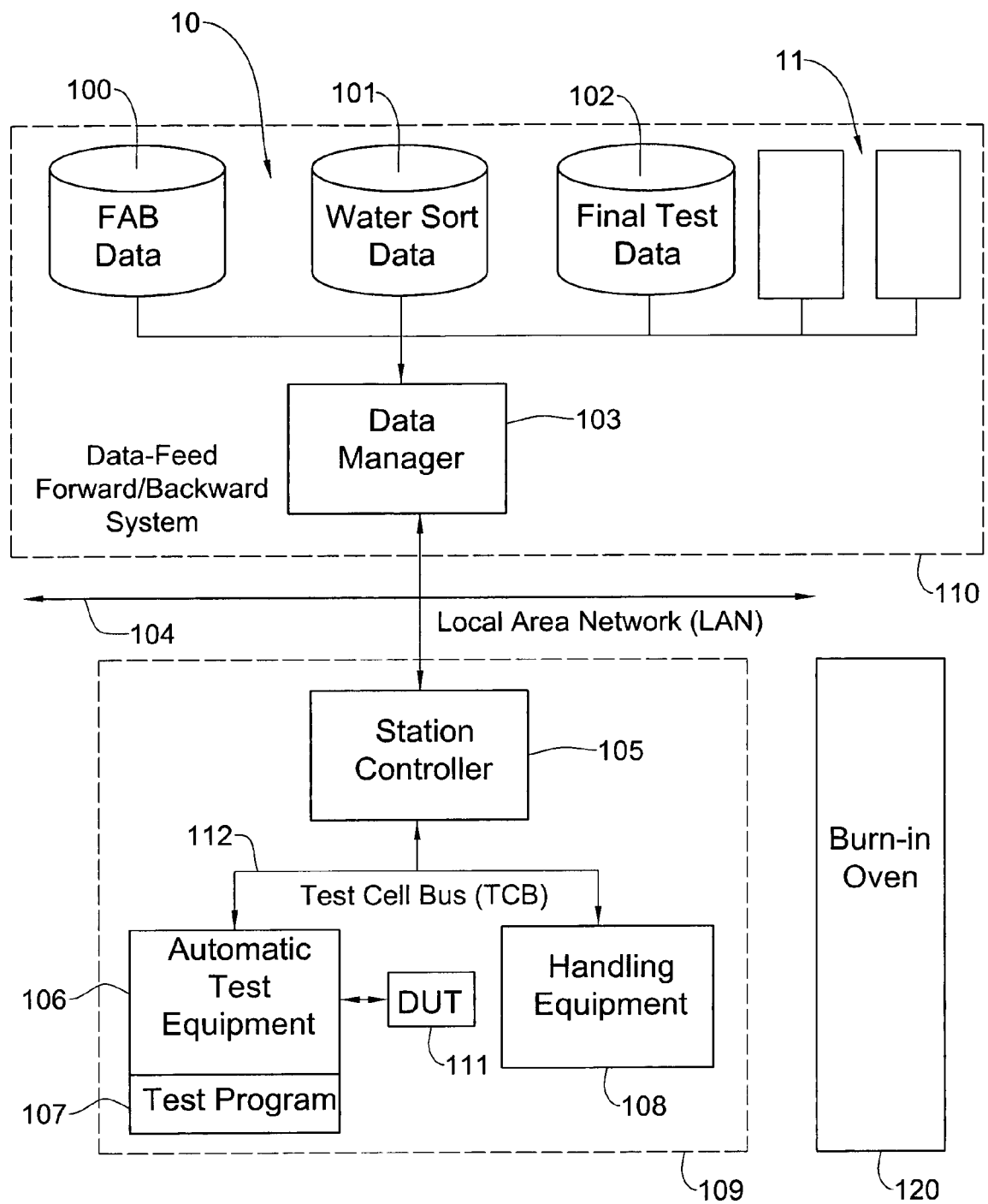
FIG. 1A is a generalized system architecture, in accordance with an embodiment of the invention.

Attention is first directed to FIG. 1A, illustrating general system architecture in accordance with an embodiment of the invention. As shown, the system includes two main components each designated to a distinct process. The first process manages gathering and analyzing of historical information 10 in a data-feed forward system 110 and makes the processed data available via a local area network 104 to a second process that controls the test cell 109. The latter includes a station controller 105, Automatic Test Equipment (ATE) 106 and handling equipment 108. A test program 107 that accommodates various test flows is used to program and sequence the ATE for testing the different populations of Devices Under Test (DUT's) 111, all as will be explained in greater detail below. Handling equipment 108 refers to a wafer prober adapted to handle wafer.

A similar test cell can be used, for instance for the final stage test, wherein the handling equipment is a device handler adapted to handle packaged devices.

Also shown is burn-in oven cell 120 used to test selected wafers in a known per se manner.

The data-feed forward system 110 which gathers, stores, and processes historical information 10 from multiple sources such as fabrication (Fab) data 100, wafer sort data 101, and final test data 102 by utilizing a data manager 103 component which consists of a suitable database and software. The historical information can be derived from other sources 11 instead or in addition to the specified sources, all as will be explained in greater detail below.

The so gathered and processed data serves in accordance with certain embodiments to determine distinct populations which are subjected to different test flows during the sort stage. Data indicative of the so determined populations of semiconductor units (e.g. semiconductor devices or distinct module(s) thereof) are stored (say, in one of the repositories 10) for further use. The populations of semiconductor units are associated with distinct test flows stored (say, in one of the repositories 10) as will be explained in greater detail below. Note that the gathering and processing of the data can be performed as a preliminary stage not necessarily in conjunction with the actual sort testing phase as performed by the control test cell 109. Thus, for example, in accordance with certain embodiments, the data feed forward system 110 can be disposed at different locations and operated at different times than the test cell 109. In the latter case, the data processed by manager 103 is provided to the station controller 105, e.g. through WAN or other means.

In accordance with certain other embodiments, the control test cell 109 and data feed forward system 110 are integrated into a single system and operated serially such that data processed by manager 103 is fed to the station controller 105, e.g. through LAN 104.

Also shown in FIG. 1A, is a station-controller 105 which consists of a conventional data processor that controls the test cell 109 via a Test Cell Bus (TCB) 112. The station controller 105 integrates information provided by the data-feed forward system 110 and uses the information to make decisions upon the data relevancy as applied to each DUT 111. More specifically, in accordance with certain embodiments, the station controller 105 can load population data (say, from the wafer sort data repository 101) and feed the data to the Handling equipment 108 (through BUS 112) enabling the latter (based on the population data) to identify the location of the Device(s) Under Test (DUT(s)) that are subjected to the test. The operation of the Data handler 108 is generally known per se and therefore will not be further expounded upon herein.

Data indicative of the so associated test flow(s) is loaded from the database (say, from the wafer sort data repository 101) and serves for modifying TP 107, e.g. by updating global variables of the TP (107). The values of the specified variables may vary from one test flow to the other. The ATE (106) can then apply the TP to the designated DUT(s) that constitute the population of devices under test.

Figure 1B:
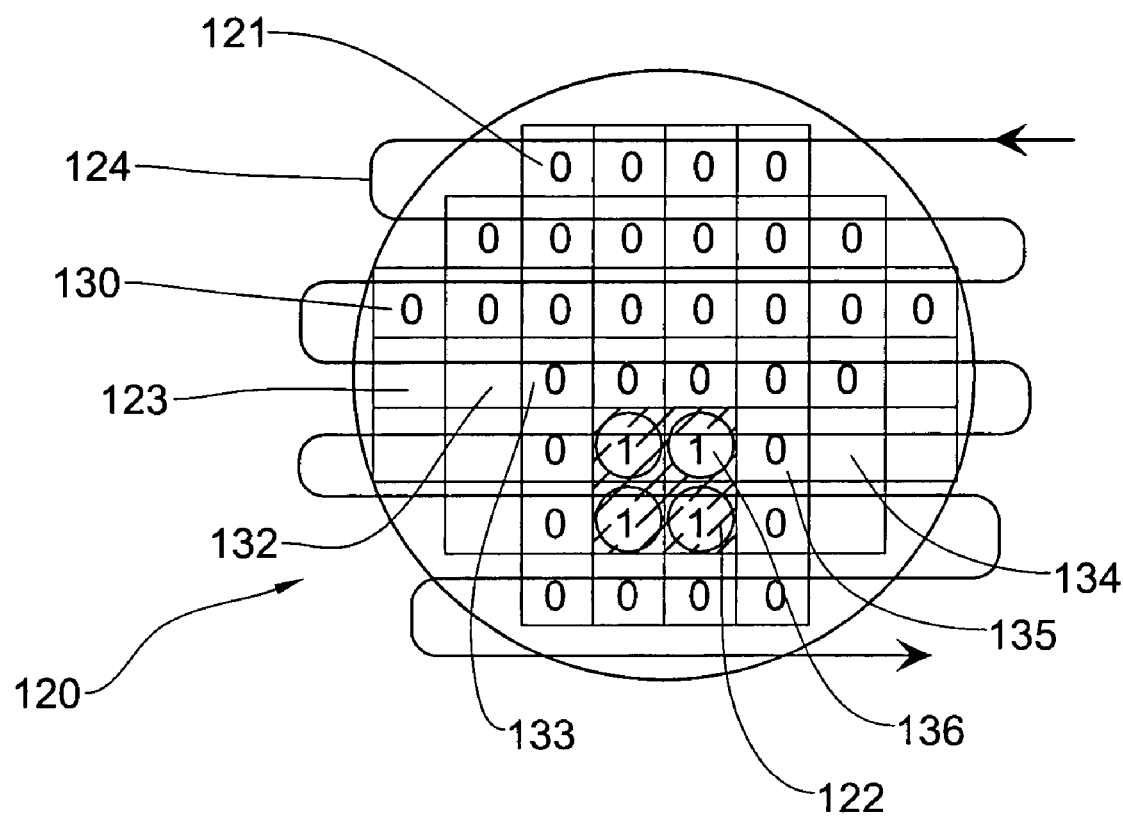
FIG. 1B is a typical test scanning of a wafer, in accordance with an embodiment of the invention.

Turning now to FIG. 1B, there is shown a typical test scanning sequence of a wafer. Thus, by this example wafer 120 includes 3 distinct populations of dice. The first population includes dice marked '0' (such as 121). The second population includes dice marked '1' (such as 122) and the third population includes dice marked 'blank' (such as 123). Each population is associated with a distinct stress test flow. The manner of determining the various populations and the associating thereto test flows will be discussed in greater detail below.

The serpentine manner of scanning the wafer is illustrated by serpentine line 124. This test scanning pattern is provided for illustrative purposes only and is by no means binding. As is well known, in parallel testing, scanning of the dice may be performed in parallel such that during each touchdown a few dice are tested simultaneously. In the example of FIG. 1B, this means that instead of testing one die at a time according to the testing sequence prescribed by the serpentine line, a group of dice, say 2×2 are tested simultaneously, and thereafter the probes are moved (in a serpentine manner) to the next touchdown, covering another group of dice to be tested, etc. The number 2×2 is provided, of course, for illustrative purposes only.

Reverting now to the station controller 105 of FIG. 1A, in accordance with certain embodiments, the data manager 103 is in charge of data manipulation and preparation so that algorithms or rules that reside inside the station controller 105 can utilize the historic information and knowledge it provides (e.g. list of populations and associated test flows) in the decision making process, including instructing the Handling equipment 108 what are the DUTs that need to be tested and modifying the TP according to the appropriate test flows associated to the particular population of devices. In accordance with certain embodiments the algorithms are basically "What/If/Then" rules that take into account the population data and test flow data and instruct accordingly the Handling equipment as well as dynamically updating the global variables of the test program.

The invention is not bound by the architecture and manner of operation of the system architecture of FIG. 1A.

The specified processes make intelligent use of various data to control the test cell 109 and optimize test coverage of each DUT 111 across the entire test coverage chain such that quality/reliability of the final product is increased.

Figure 2:
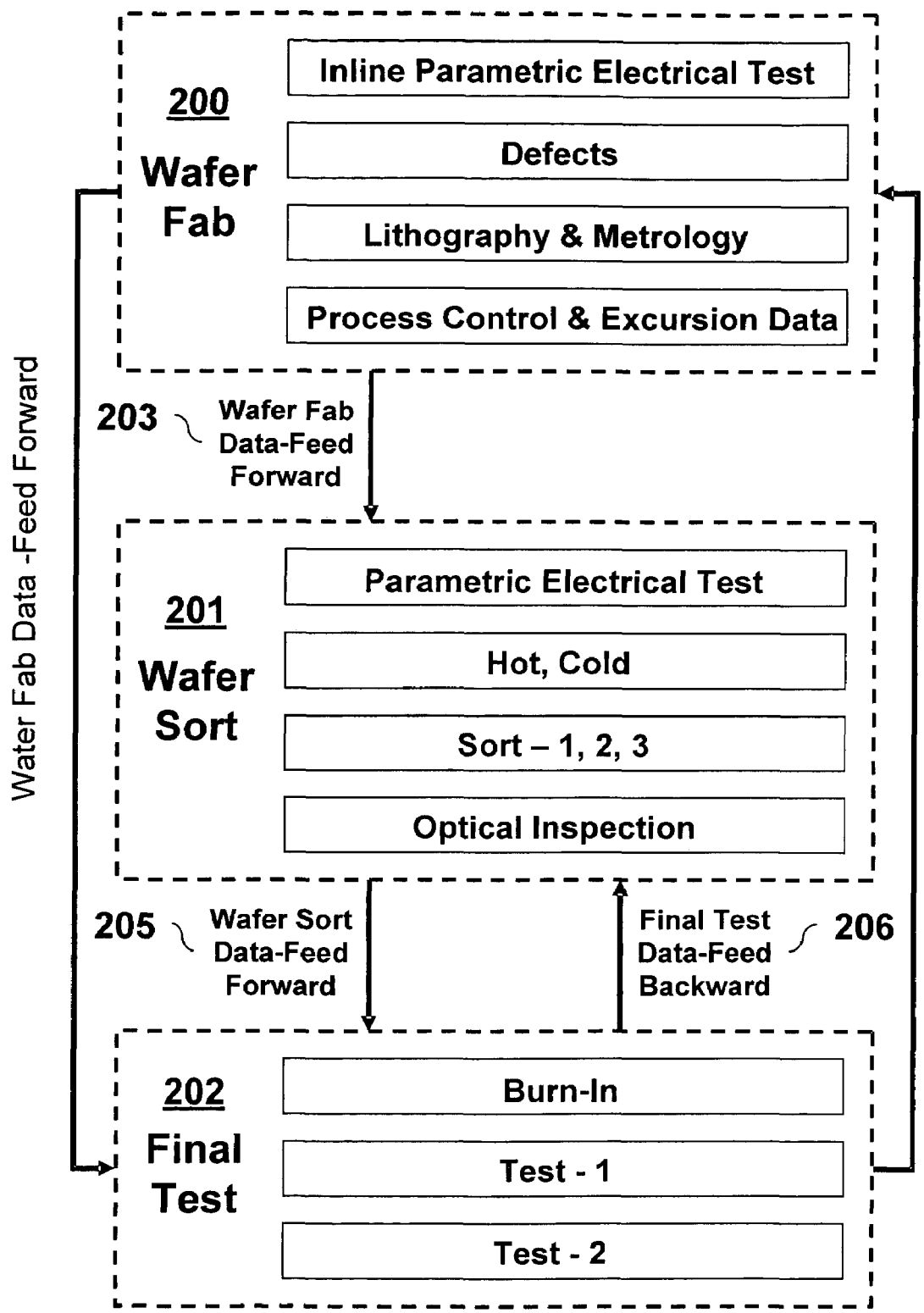
FIG. 2 is a flow diagram showing data-feed forward sequence in accordance with an embodiment of the invention.

FIG. 2 shows a data-feed forward sequence in accordance with an embodiment of the invention, aims at gathering and analyzing information for identifying distinct populations of semiconductor units. FIG. 2 is an exemplary drill-down illustration of the feed forward process of data gathered from the repositories 10 and analyzed by Data manager 103 (of FIG. 1A).

The flow diagram is divided into three semiconductor manufacturing sections namely, wafer fabrication (Fab) 200, wafer sort 201 and final test 202. Each of the sections may contain multiple manufacturing or testing steps where measurements are performed and data is stored. Examples of data (forming example of historical data) that can be gathered, processed and fed forward from the wafer Fab 200 include inline electrical parametric tests on the wafers scribe line, lithography and metrology data, defects review and analysis data, Advanced Process Control (APC) data and other wafer manufacturing data. By way of non-limiting example, a population of devices exhibiting shift in the results of one or more of the specified test measurements (exceeding a given threshold) may be subjected to additional stress test sequences, all as will be explained in greater detail below.

The processed historical information may serve for determining population of semiconductor units that will be subjected to distinct test flows in accordance with various embodiments of the invention as will be explained in greater detail below.

As further shown in FIG. 2, at sort stage 201, finished wafers are tested for the first time by applying appropriate test flows to corresponding populations of semiconductor devices (data of which is incorporated in the test program) and using to this end the station controller 105 and ATE 106.

The historical information that affects the determination of the populations/tests that will be applicable at sort stage can be derived also from previous sort stages.

By way of non-limiting example these data may include data from all test phases such as hot, cold, functional, structural, Sort 1, Sort 2, Sort 3, optical inspection data from wafer sort 201; stored data from previous tested wafers and lots; test results from neighborhood dice.

In accordance with a certain embodiment, historical information may be gathered also from previous final test 202 stage where assembled and packaged devices are tested at various testing steps such as: final1 and final2 to augment product reliability.

Note that it is not, of course, necessarily required to collect historical information from all the manufacturing stages and accordingly information can be gathered and analyzed from only selected one or more stages.

As will be further discussed below, the historical information may be gathered and analyzed from other sources, designated generally as 11 in FIG. 1A.

There follows now a list of additional sources of data which may serve as historical information for determining distinct populations.

Thus, in accordance with certain embodiments, at least one of the following sources may be used in addition or in lieu of the data sources discussed above with reference to FIG. 2.

1. Shifts or failure signatures in wafer Fab parametric E-Test may require more stress testing at wafer sort. For example, a shift in a parameter tested in the scribe line may provide an indication for a quality or reliability fail candidate population that embraces few dice (or sub-die module(s)). This may require more stress test during future sort stage testing.

2. Shifts or failure signatures in wafer Fab Particle signatures may require more stress testing at wafer sort. For example, a shift in a particle signature may provide an indication for a quality or reliability fail candidate population that embraces few dice (or sub-die module(s)). This may require more stress test during future sort stage testing.

3. Shifts or failure signatures in a given socket at a given stage (say, sort) may require more stress testing at future test. For example, it may stipulate on testing of the same or different socket during future sort testing. Thus, by way of non limiting example, shifts in signatures in sort3 testing of a given lot, may prescribe that additional stress testing will be applied in sort3 (i.e. same socket) of the next tested lot. Or, by way of another non limiting example, it may prescribe that additional stress testing will be applied in sort2 (i.e. socket −1) of the next tested lot. Or, by way of yet another non limiting example, it may prescribe that additional stress testing will be applied in sort4 (i.e. socket +1) of the next tested lot. These examples are of course not binding and others may apply e.g. shifts or failure signatures in a given socket at a final stage test may require more stress testing at future final testing.

4. Memory IC's or IC's that contain memories (i.e., microprocessors) may have redundancy repair features built-in. IC's with a high repair rate are usually subjected to more reliability issues then IC's with minimal repairs and therefore may constitute an exemplary quality or reliability fail candidate population that requires more stress test during future sort stage testing. In other words, the more redundancy is activated in a given population, the more reliability testing is required in the later tested population.

5. Any process window parameter can go out of statistical control in the Fab. If the control systems in the Fab do not correct the problem before the lots move on to other manufacturing or test steps, some of the material may have reliability issues. These lots referred to as excursion lots may require a different stress flow at wafer test. This data would be fed-forward to from wafer Fab to wafer sort and the specified population (e.g. these excursion lots may require additional stress test during the subsequent sort and/or final test stages).

Those versed in the art will readily appreciate that the examples discussed above (with reference to 1-5) and with reference to FIG. 2 are by no means binding, and accordingly other sources of historical information may be used in addition or in lieu of the above.

It should be further noted that there may be distinct populations defined in accordance with the corresponding historical information. For instance there may be a first population of devices or modules (being subjected to first test flow) that is defined based on Shifts or failure signatures in wafer Fab parametric E-Test (see 1 above) and a different population of devices or modules (being subjected to a second test flow) that is defined based on Shifts or failure signatures in wafer Fab Particle signatures (see 2 above).

It should be further noted that there is not necessarily one to one correspondence between the historical source of information and the identified population. For instance two or more of the specified sources may be combined to define a given population that is subjected to a given stress test flow. For instance (and for illustrative purposes only), an elevation on a parameter like gate leakage in Etest testing may identify a given population. If a portion or all the specified population is identified in the sort test as outliers (e.g. devices having test results which deviate from the norm of neighboring dice) then this may reinforce the need to apply a more demanding stress test sequence to the specified population (e.g. in a wafer from the same lot) that will undergo future sort testing stage.

It should be further noted that whilst the description above focused on determination of populations and associated stress test sequences that will be applied on semiconductor units during sort stage, in accordance with certain other embodiments the stress sequences will be applied mutatis mutandis to populations of semiconductor devices or modules thereof during the final test stage (where, normally, the devices are already packaged).

In accordance with certain embodiments, reliability problems identified at packaged devices at final stage can normally be traced back to specific X-Y locations on the wafer. This will be exemplified in the following non-limiting examples. (i) In the case that certain packaged devices are identified as fail candidate population during final test stage, then applying a tractability technique would allow to identify that all those devices originate, for instance, from X,Y locations of the edge region of a wafer. Based on this observation, dice that reside in the X,Y locations of edge region of yet untested wafers can be subjected to stress test during future sort testing. (ii) In accordance with another non-limiting example, assuming that during sort stage, edge wafers are identified as a fail candidate population that should be subjected to additional stress tests in the following final test stage. Then, when the final test stage actually occurs, it is mandatory to apply tractability techniques in order to identify the packaged devices that originate from the X,Y locations of the wafer's edge region in order to apply to these devices the desired additional stress tests.

Traceability techniques are generally known per se. Some products/processes use traceability techniques in order to trace the device ID (Lot, Wafer & X/Y coordinates) after it has been "sawed" from the wafer. This traceability can be done by inside the unit itself using fuses or using database trace techniques. Note that in certain scenarios in final stage testing there is no need for applying tractability techniques for identifying the "origin" of the device. This in particular applies to feed backward techniques, such as identifying outliers (as will be discussed in greater detail below with reference to FIG. 6).

Figure 3A:
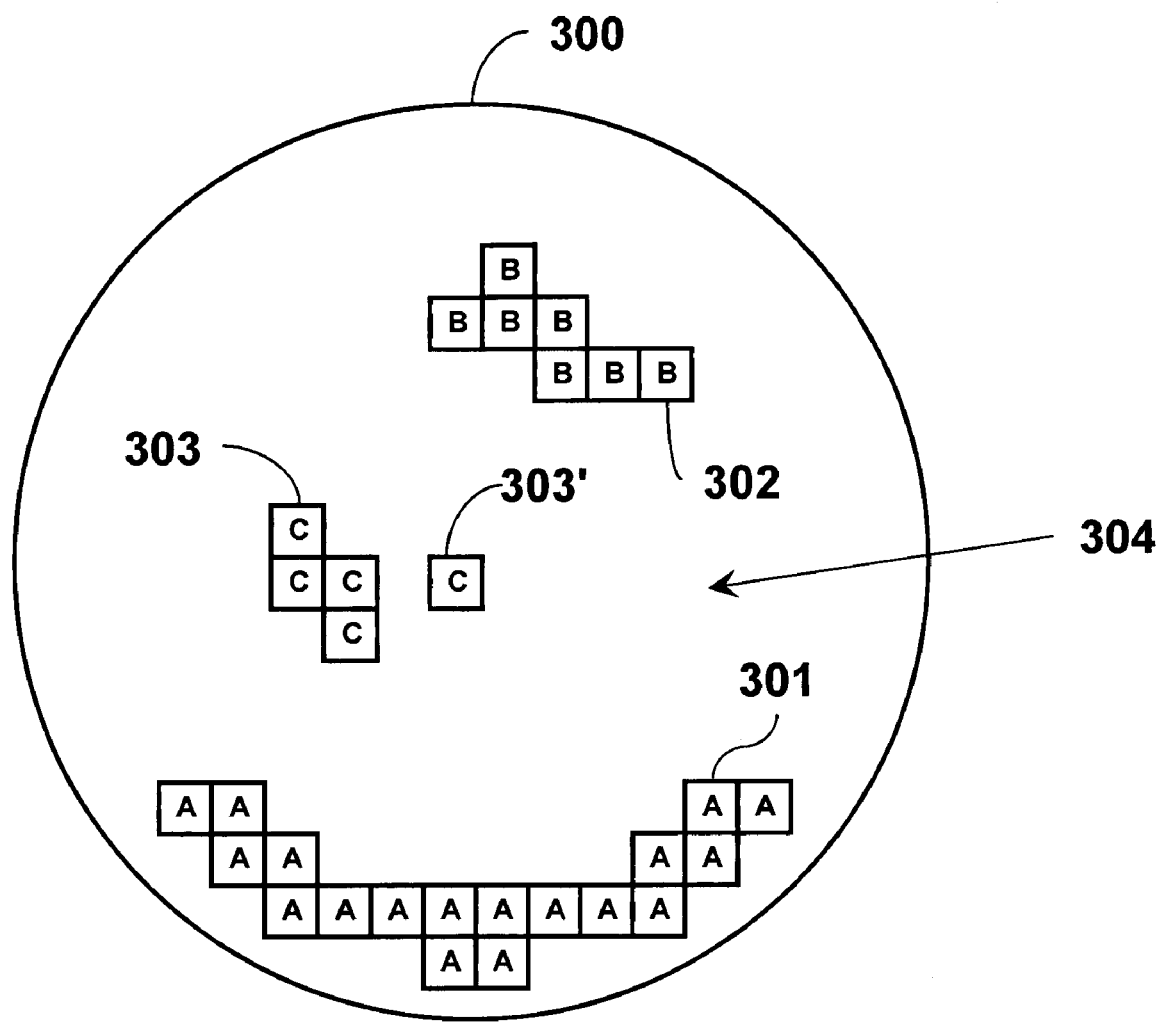
FIG. 3A is a schematic illustration of semiconductor wafer showing distinct quality or reliability fail candidate populations, in accordance with an embodiment of the invention.

Attention is now drawn to FIG. 3A showing a schematic illustration of semiconductor wafer showing distinct quality or reliability fail candidate populations.

FIG. 3A shows semiconductor devices (dice) in areas on a typical semiconductor wafer 300 that represent distinct populations of semiconductor devices (that will undergo test during sort stage according to associated stress test flows).

Three examples of systemic common failure areas expressed in geographies over the wafer 300 are depicted by areas with reliability problems due to process characteristics 301 yield common failures 302 and customer common failures 303.

Thus, by analyzing historic information gathered during the wafer FAB stage (as exemplified in the description above with reference to FIG. 2 above), a geography that embraces the semiconductor devices (marked A) 301 is identified as a quality\reliability fail candidate population. In accordance with certain embodiments, reliability problems of population 301 due to process characteristics are caused by wafer fabrication process variations in different areas or geographies across the wafer. It is well known that fabrication process variations will cause devices to either malfunction or have marginal operating characteristics, resulting in certain geographies over the wafer exhibiting different yields. For example, edge dice on a wafer usually have lower yield than dice in the center of the wafer. Products from such low yielding geographies are generally subject to more reliability problems. The population that includes the specified dice is a quality or reliability fail candidate and is associated with a test flow that includes stress tests which aim at anticipating those devices which are susceptible to quality or reliability problems.

Similarly, by analyzing historical information that pertain to yield common failure (as exemplified in the description above with reference to FIG. 2 above), a geography that embraces the semiconductor devices (marked B) 302 is identified as a quality\reliability fail candidate population. As is well known, a yield common failure relates to a population of that exhibits drop in the yield score and is characterized by a common failure signature (say, all failed dice have a Bin=8 score). In accordance with certain embodiments, reliability problems of population 302 due to yield common failures are identified by lots or wafers with lower than expected yield. It is well known in the semiconductor industry that semiconductor devices from lots or wafers exhibiting a significantly lower yield than expected from historical yield data are subject to increased reliability problems. For example, a wafer yielding 70% instead of the normal and expected 90% yield for that particular product will normally include dice that have increased reliability issues. The population that includes the specified devices is a quality or reliability fail candidate and is associated with a test flow that includes stress tests which aim at anticipating those devices which are susceptible to quality or reliability problems.

By the same token, by analyzing historical information that pertain to customer common failure (e.g. information collected from customers identifying common failures in the functionally of the end product), a geography that embraces the semiconductor devices (marked C) 303 is identified as a quality\reliability fail candidate population. Identifying the specified population may require application of tractability techniques, discussed above. For example, in accordance with certain embodiments, reliability problems of population 303 due to customer common failures are specific products rejected by the customer that can be traced back to specific X-Y locations on the wafer.

In accordance with certain embodiments, systemic common failures are malfunctioning devices (303) within the wafer 300 with common failure characteristics By this embodiment, such systemic common failures are analyzed through a common process that tries to identify such areas either through test measurement analysis, process analysis or other means. Not all common failure areas are a potential reliability concern while others are known to be highly correlative to reliability problems.

The population that includes the specified devices is a quality or reliability fail candidate and is associated with a test flow that includes stress tests which aim at anticipating those devices which are susceptible to quality or reliability problems.

Reverting to FIG. 3A, the unmarked areas 304 on wafer 300 represent the normal ("other") population of semiconductor devices which are not identified as a quality or reliability fail candidate population and as such are subjected to less stress testing. There may be one or more of this other populations (in FIG. 3A there is only one population area designated 304). The stress testing sequence for at least one of said other populations (304 in the case of FIG. 3A) includes applying to the devices a test vector(s) or pattern(s) at increased voltage (e.g. test VDD) compared to corresponding operating voltage (e.g. reference VDD) as prescribed by the specification for this product. Thus, for example, if the operating voltage specification for the manufactured semiconductor devices of a given product (including, of course, the dice in wafer 300) is $X \pm \Delta$ volts, then the voltage applied during stress test to the devices in area 304 is Y volts, where $(Y>X+\Delta)$. There may be certain scenarios where there are few power supplies operating distinct modules in a device. For instance, if the device includes a memory module and an analog module, it may be the case that the memory module is powered by a Vdd having operating voltage specification of $X_1 \pm \Delta$ volts, whereas the operating voltage specification for the analog module is $X_2 \pm \Delta$ volts, where $X_2 \neq X_1$.

In this particular example, the stress test for the other population (dice in area 304) may prescribe that (i) the stress test voltage for the memory module would be $Y_1$ volts where $Y_1>X_1+\Delta$ or (ii) that the stress test voltage for the analog module would be $Y_2$ volts where $Y_2>X_2+\Delta$ or (iii) both conditions apply.

Note that at least one of the other populations may be subjected to additional stress testing (not necessarily only increased voltage).

The invention is not bound by these examples.

Those versed in the art will readily appreciate that the specified three examples of quality\reliability fail candidate populations (designated 'A' dice, 'B' dice and 'C' dice, respectively) are by no means inclusive of all possible systemic failures, but are intended to illustrate non limiting examples of dice that are subjected to stress tests for improving reliability.

The description above referred mainly to population(s) of semiconductor devices (dice) within a wafer, say four distinct populations accommodated in wafer 300. This however is not binding.

Thus, in accordance with certain embodiments, at least one of the populations includes all devices within a wafer (or few wafers) (say, all dice in wafer 300 are 'A' dice), whereas other wafer(s) in the lot accommodate different type of population(s). For example, another wafer includes dice all belonging to type 'B' and the rest of the wafers in the lot accommodate "normal" dice (like 304), etc.

In accordance with certain embodiments the quality or reliability fail candidate population includes all wafers in a given lot whereas other lot(s) of the same product includes different population(s).

In accordance with certain other embodiments, a combination of the above applies. For instance, all dice in two wafers of a given lot include dice of type 'A' and a third wafer in the same lot includes dice of different populations, say, similar to wafer 300.

Those versed in the art will readily appreciate that the invention is not bound by these particular examples.

Note that the discussion with reference to FIG. 3A focused on semiconductor devices. However, the invention is not bound to semiconductor devices and, accordingly, other semiconductor units may apply, such as module(s) of semiconductor devices. In accordance with certain embodiments the modules are functional modules. A non-limiting example in which the test may focus on modules is Multi-Signal Devices (MSD) or System On a Chip (SOC) integrated circuits that contain different functional modules, each with different geometries within a single packaged IC. For example, a SOC can contain a logic module, an analog module, a memory module and others.

It should be noted that the stress test sequence may focus on modules (rather than devices) if the analysis identifies modules. For instance, the process characteristics analysis may identify shifts in test results of a given module (say an analog module or memory module) in any of the dice 'A' population (see 301 in FIG. 3A). This may suggest that the specified population (e.g. the analog module in each die in the specified geography) should be subjected to additional stress tests.

Figure 4:
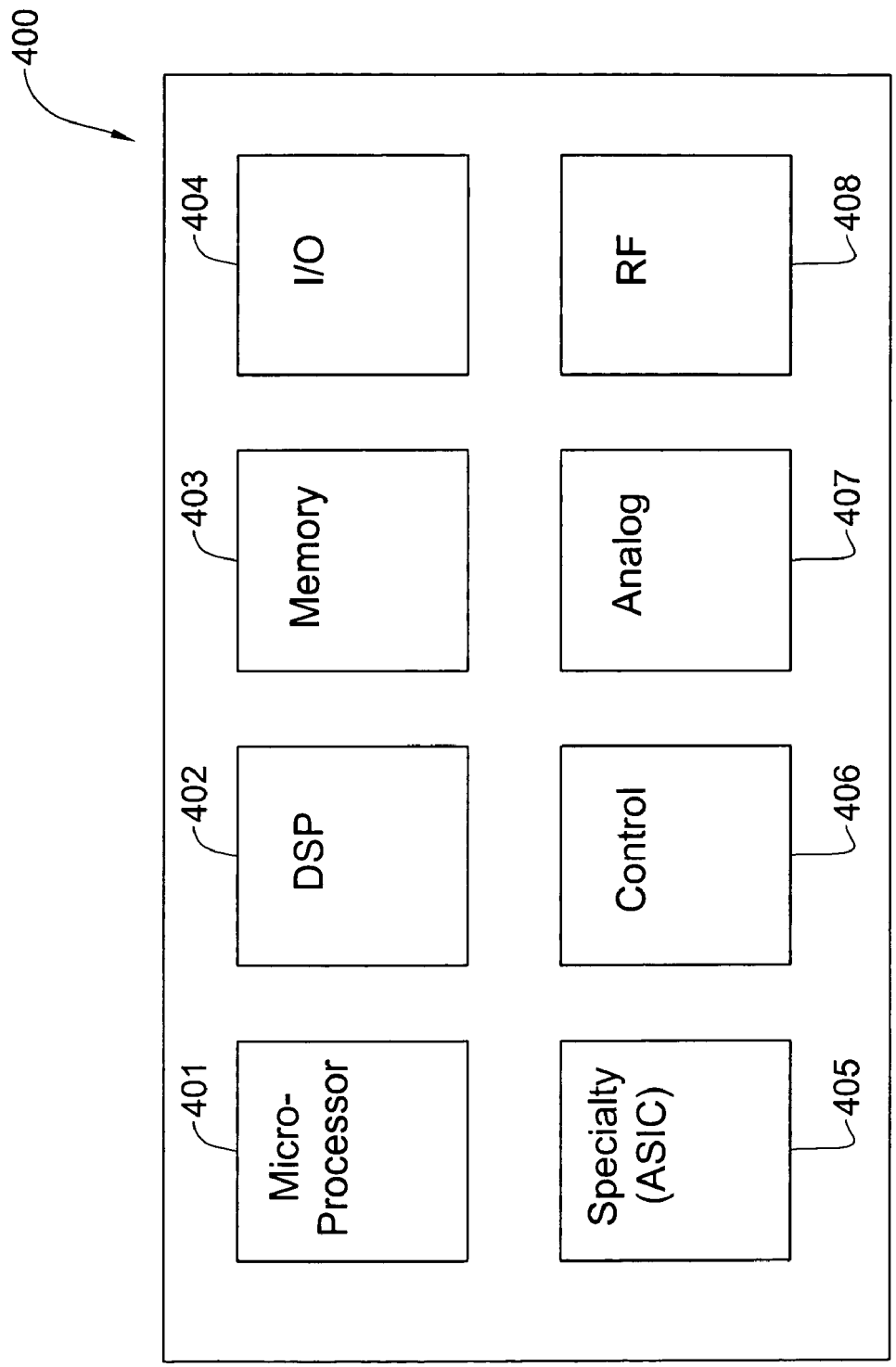
FIG. 4 illustrates schematically a semiconductor device (including few functional modules) that is subjected to the augmentation of quality or reliability technique, in accordance with an embodiment of the invention.

Bearing this in mind, attention is directed to FIG. 4, illustrating schematically a semiconductor device 400 that includes few functional modules, in accordance with an embodiment of the invention. By this example the die 400 includes the following functional modules" Micro-processor 401, DSP 402, Memory 403, I/O 404, a customized ASIC 405, Control module 406, Analog module 407 and RF module 408. The invention is of course not bound by this example.

The analysis of historical information for identifying population(s) of semiconductor units may apply also to modules. For instance, the population encompassing 'A' dice may refer to distinct module or modules within a die. For instance, the test flow that includes a given stress test is associated to a population that includes module(s) of 'A' dice, e.g. the Analog module 407 of dice 400. By this specific example, the other modules of 'A' dice may be classified as normal modules (subjected to less or no stress), or to different quality or reliability populations, as discussed in detail above.

It should be noted that the scope of the population(s) may vary in a similar manner as described above in respect to semiconductor devices. Thus, for example, in accordance with certain embodiments, a given population extends to one or more module in one or more devices in a wafer, or in accordance with certain embodiments a given population extends to one or more modules in all devices of one or more wafers in a lot, or in accordance with certain embodiments a given population extends to a given lot of a product, etc. Other variants are applicable including, but not limited to, combinations of modules and devices, e.g. a given stress test flow is associated with a population that extends to certain devices, whereas other stress test flow is associated with a population that extends to functional module(s) of identical or different devices.

Figure 5A:
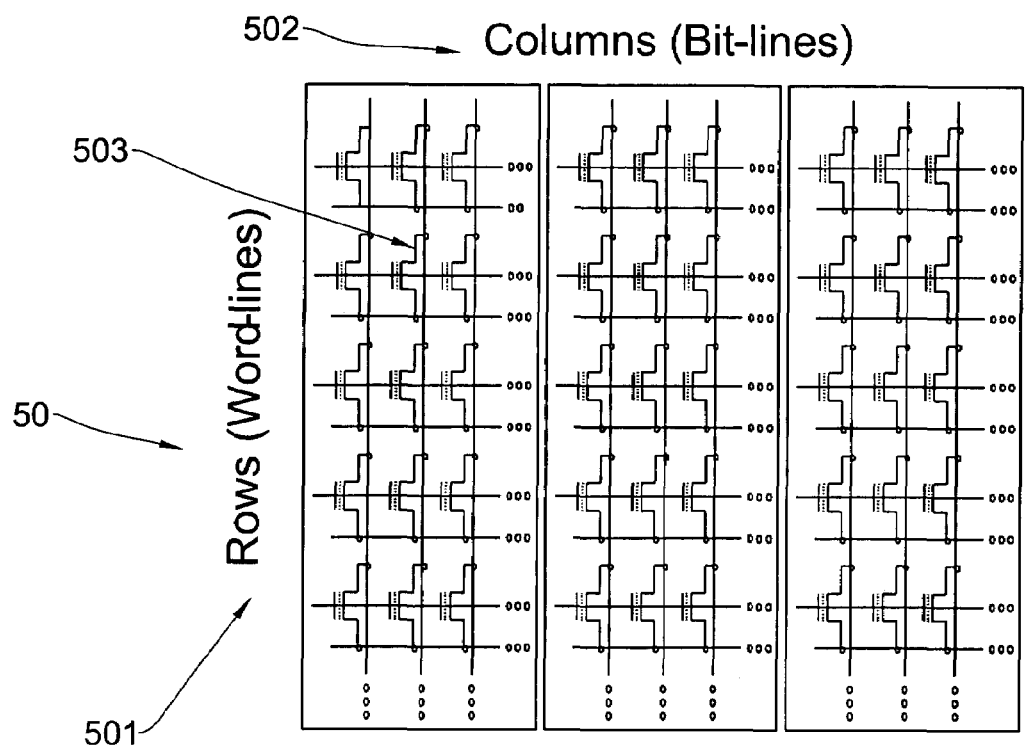
FIG. 5A illustrates schematically a flash memory device, that is subjected to the augmentation of quality or reliability technique, in accordance with an embodiment of the invention.

In accordance with certain embodiments, the modules are not necessarily functional modules. For a better understanding of the foregoing, attention is directed to FIG. 5A illustrating schematically a memory device (e.g. a flash memory device) 500, that is subjected to the augmentation of quality or reliability technique, in accordance with an embodiment of the invention. As shown, the device includes rows of memory cells 501 and columns of memory cells 502. In the context of memory device, a module can be a row of cells or a portion thereof (e.g. one, or few cells which the case may be) or a column of cells or portion thereof (e.g. one, or few cells which the case may be) or an block of cells (e.g. a 3 by 3 block 503). The invention is of course not bound to the specific example of memory device and to the specific modules discussed with reference to FIG. 5A. Note also that 500 is not necessarily a memory device, but can be, for example, a memory module within a device (as described above with reference to FIG. 4).

In the context of memory devices or modules (referred to as memory units), it should be noted that in accordance with certain embodiments, Memory units may have redundancy repair features built-in. Thus, Memory units with a high repair rate are usually subjected to more reliability issues then units with minimal repairs and may require a different stress flow at final test.

Having described an embodiment that utilizes a memory device or a module, attention is reverted to FIG. 3A for describing yet another embodiment of the invention focusing on identification of population(s) that encompass geographic area and in accordance with yet certain other embodiments population(s) that encompass dice within the same lithography exposure, or dice with the same location across lithography exposures.

Thus, based on the analysis of the historical information, a population of devices is defined that encompasses a geographical area in the wafer 300. In accordance with certain embodiments, the analysis leads to identification of a geographical area encompassing a cluster of at least two consecutive dice. The term cluster of consecutive dice means that any die in the identified cluster has at least one neighboring die which also belongs to the specified cluster. Note that insofar as the specific example of FIG. 3A is concerned, all the dice marked 'A' fall in the cluster 'A', and likewise all the dice marked 'A' fall in the cluster 'B', however, cluster 'C' encompasses the four left hand dice but not die 303' since the latter has no neighboring die that belongs to the cluster.

Figure 3B:
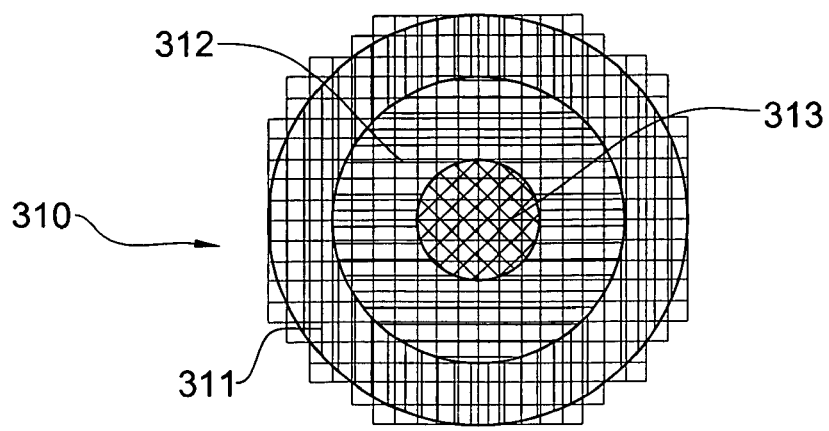
FIGS. 3B-3D illustrate schematically a few distinct geographies that are subject to the augmentation of quality or reliability technique, in accordance with an embodiment of the invention.
Figure 3C:
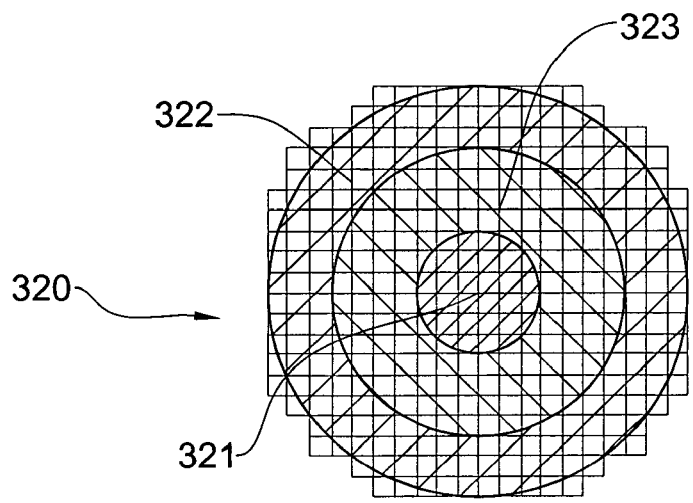
Figure 3D:
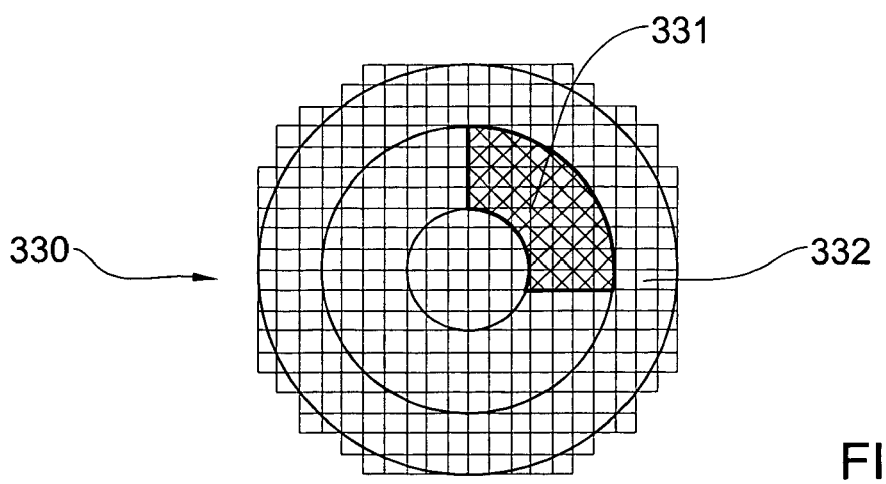

The invention is not bound by a specific geography. Thus, FIGS. 3B-3D illustrate schematically a few distinct geographies that are subjected to the augmentation of quality or reliability technique, in accordance with an embodiment of the invention. As shown in FIG. 3B, the wafer 310 is divided to distinct rings 311, 312 and 313 each constituting a distinct fail candidate quality or reliability population. FIG. 3C illustrates a so called "doughnut" like geography. As shown, the first geography is the internal ring 321 and the external ring 322 of the wafer 320 and the second geography is the middle ring 323. FIG. 3D illustrates a so called "3 o'clock" geography where a certain sector 331 of wafer 330 constitutes a geography whereas the other regions of the wafer 332 will constitute another geography. Obviously, any i o'clock option (not necessarily 3) is valid. Each of the specified geographies (in FIGS. 3B-3D) can be deducted, e.g. by analyzing for example process characteristics failures. Each of the specified geographies, say in FIG. 3B or 3C or 3D, which the case may be, will be subjected to a distinct test flow. The invention is of course not bound by the specific examples of FIGS. 3B-3D.

As well known, in a typical lithography process (during the FAB stage) patterns are exposed through mask onto the semiconductor substrate leading eventually (after undergoing various processes including development and etching) to the manufactured dice. Typically, the number of dice that result from a single exposure is smaller than the number of dice in a wafer and, therefore, few exposures are required in order to cover the whole wafer. These groups of dice are referred to as dice within the same lithography exposure, or in accordance with certain other embodiments dice with the same location across lithography exposures. Since each exposure is characterized by unique ambient (and possibly other) parameters, it may well be the case that the quality or reliability of the resulting dice from this particular exposure may be different than the quality or reliability of dice resulting from a different lithography exposure. Thus, in accordance with certain embodiments, the historical analysis identifies a population that is confined to a single lithography exposure. There may be of course more than one population each associated with a respective lithography exposure, and obviously also other population(s) as discussed in detail above.

Figure 5B:
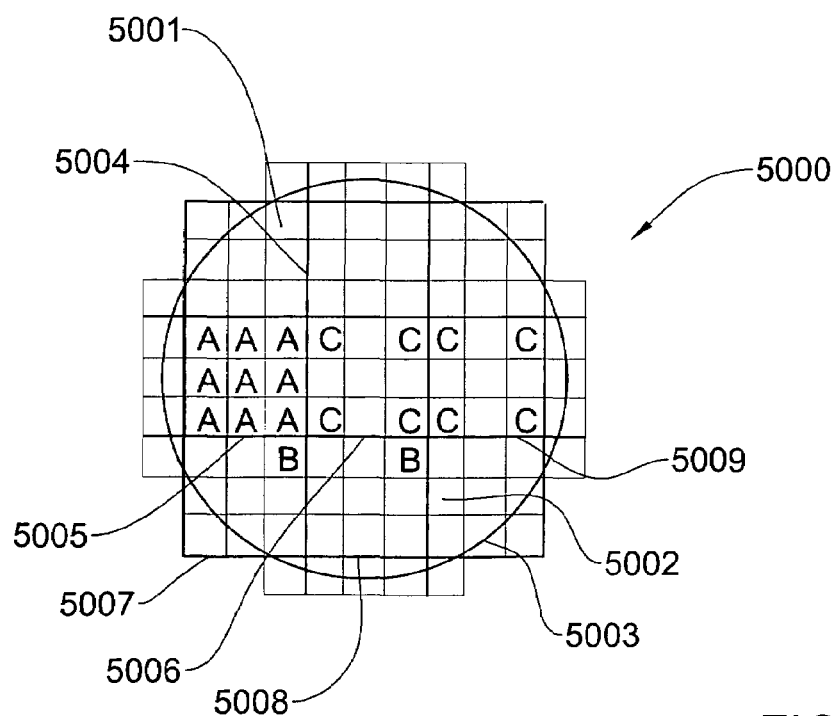
FIG. 5B illustrate a group of dice that result from a single exposure through a mask as well as across exposures, in accordance with a certain embodiment of the invention.

For a better understanding of the foregoing, attention is drawn to FIG. 5B illustrating a group of dice that result from a single exposure through a mask as well as across exposures, in accordance with a certain embodiment of the invention.

For example, wafer 5000 includes (for illustrative purposes only) few dice each marked as a small square (e.g. 5001). As is well known the wafer include complete dice (such as die 5002) and incomplete dice that are only partially accommodated in the wafer 5000 (such as die 5003). Obviously, only the complete dice are of interest.

As specified above, the dice are manufactured through a lithography exposure process, such that in each exposure fewer dice are treated. In the specific example of FIG. 5B, each lithography exposure embraces 9 dice and is marked as a bounding box (say 5004 or 5005). As shown, the nine dice marked 'A' fall within a lithography exposure 5005 and can constitute a fail candidate quality or reliability population (if identified as such in the data analysis process described above). Similarly, the four dice marked 'C' fall within a lithography exposure 5006 and can constitute a fail candidate quality or reliability population (if identified as such in the data analysis process described above).

In accordance with certain embodiments the so determined population may embrace dice within the same location in an exposure across two or more exposures. This population is of course identified in the data analysis process described above.

For example, the two dice marked 'B' reside in the upper right corners of lithography exposures 5007 and 5008, respectively and may share for example a similar process characteristics problem and as such be subjected to appropriate stress test sequence. Similarly, the dice marked 'C' reside in the corners of lithography exposures 5006 and 5009 respectively and may share, for example, a similar process characteristics problem and as such be subjected to appropriate stress test sequence.

The invention is of course not bound by this example. Thus by way of non limiting example: (i) the dice within exposure are not bound to a single exposure in a wafer and/or to a single wafer; (ii) the dice across exposures are not necessarily bound to a single wafer, (iii) the dice within exposure and dice across exposures are not necessarily bound to the same wafer; (iv) the population whether within exposure or across exposures can refer to semiconductor devices or modules, which the case may be. Other variants are applicable, all as required and appropriate.

Note that the specified analysis of historical data (discussed with reference to FIGS. 3-5 above) can be performed off-line (e.g. by system 110 of FIG. 1A) and the population (and possibly the associated flow test) data can be stored and used during a later sort stage (e.g. to system 109 of FIG. 1A). In accordance with certain embodiments the specified analysis can be performed during sort stage and as result update the populations/associated test flows in a dynamic fashion.

The description above of the various embodiments with reference to FIGS. 3-5 was confined to the sort stage. In accordance with certain embodiments the specified embodiments may be applied mutatis mutandis to the final stage (where the devices are normally tested in a packaged form). In most cases, it may be required to trace the origin of the packaged device (namely the location of the corresponding die in earlier stage wafer (at sort) and/or at earlier manufacturing stages). This is normally achievable using known per se tracing techniques, discussed above. In certain cases there is no need to trace the origin (e.g. X,Y location of the die in the wafer) of the test device or module (during final stage) as will be evident in the example below that refers to outliers.

The description above referred to various embodiments of analyzing historic data in a feed forward approach and based on the analysis identifying populations that are subjected to corresponding test flows. The invention is not bound to feed forward analysis. The description below focuses on a feed backward mechanism, in accordance with certain embodiments of the invention.

Thus, in accordance with certain embodiments, the backward analysis analyzes data gathered and processed at sort stage (and/or possibly in other stages, such as final stage) to identify a new population of devices (or modify an existing population) that is classified as quality or reliability fail candidate. The latter population(s) is subjected to additional stress flow tests (either repeating an already existing stress test flow or applying modified stress test flow), in order to identify those devices that are susceptible to quality or reliability problems (based on the additional data that was gathered and analyzed in the sort stage). In accordance with certain embodiments the analysis leads to modifying the test flow (or generating a new one) applied successively to one or more of the existing populations, e.g. in order to load additional stress on these population(s) which the analysis, during sort, emphasized their susceptibility to quality or reliability problems. Detecting outlier devices are a non-limiting example of applying feed backward technique, as will be described with reference to FIG. 6, below.

Figure 6A:
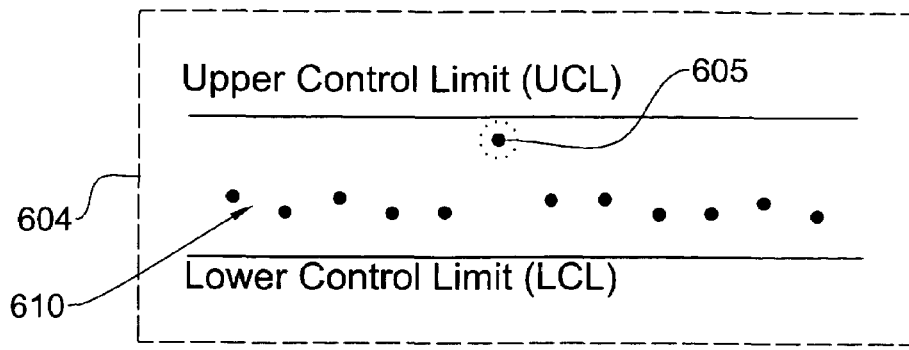
FIGS. 6A-6C are three graphs showing various types of detected outlier dice, in accordance with an embodiment of the invention.
Figure 6B:
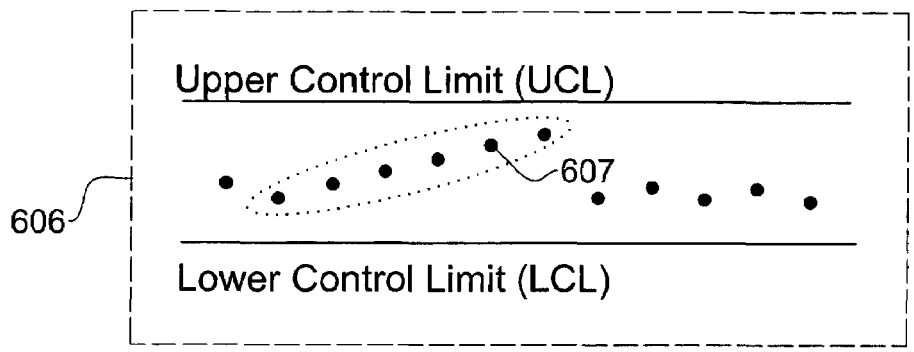
Figure 6C:
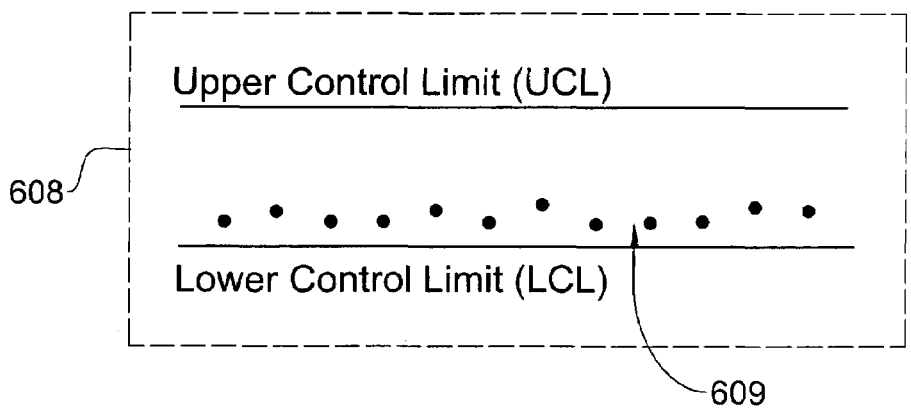
Figure 6D:
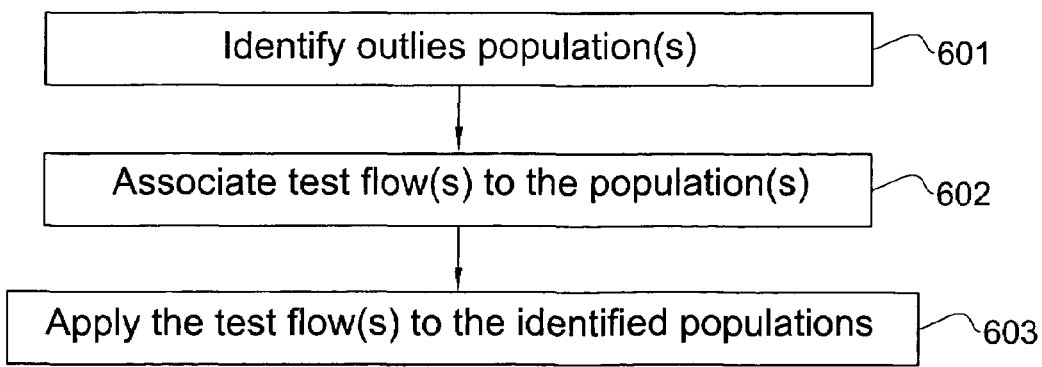
FIG. 6D illustrates schematically a flow diagram of a feed backward sequence of operations, in accordance with an embodiment of the invention.

Thus, FIGS. 6A-6C are three graphs showing various types of detected outlier dice, in accordance with an embodiment of the invention. The specified graphs are of course not binding. FIGS. 6A-6C concern the specific case where the analysis of data gathered at sort stage aims at identifying a new population (or new populations) that is subjected to additional stress test sequences. The sought population is outlier dice. As is well known, outliers are test measurements outside the six-sigma distribution limits but within the product specification limits. Devices identified with such outlier test values are usually subject to increased reliability problems.

Reverting to FIG. 6A, a graph of an outlier sub-test value 604 shows an outlier test measurement value 605 that is within the upper and lower control limits but is significantly different to all the other test values.

The graph of FIG. 6B (606) shows a group 607 of test measurements trending toward an out-of-control condition. Once again the measured values are within the upper and lower control limits, however, devices identified to have trending test values toward either the upper or lower control limit have also been shown to have increased reliability problems.

The graph of FIG. 6C (608) shows a group of test measurements that are close to the lower control limit 609. Although these test values are within the upper and lower control limits, devices identified to have marginal test values have also been shown to have increased reliability problems.

The other dice (not classified as outliers), say 610 of FIG. 6A may potentially be less susceptible to quality or reliability problems and therefore require less or no stress tests.

Having exemplified various non-limiting forms of outliers, there follows a feed backward procedure (with reference to FIG. 6D) in accordance with an embodiment of the invention. Thus, at the onset, an outlier population of dice is identified (601) (e.g. by using known Part Average Testing (PAT) techniques, or for example the technique disclosed in U.S. Pat. No. 6,184,048 (Ramon). Next, new (or existing) stress test flow(s) are associated (602) and re-applied (603) to the specified outlier population(s).

The determination of the appropriate test flow that will be applied to the so detected outliers is normally determined during a preliminary calibration phase (of associating test flows to distinct populations). Generally speaking, a repertoire of possible outlier groups characteristics is a priori defined and is tested in the preliminary calibration phase in order to assign a test flow per "outlier group". The latter procedure of associating a test flow to a distinct population will be discussed in greater detail with reference to FIGS. 9 and 10. In operation, whenever outlier(s) are detected (say 607 of FIG. 6B), they are "classified" to an already defined group of outliers (which during calibration phase was associated with a given stress test flow) and the latter stress test flow will be applied to the so detected outliers (in this example 607).

It is noted that in accordance with certain embodiments, a shift in the number of outliers or in the characteristic of the outliers may require more stress testing at sort test. For example, any identified outliers during sort stage may identify an exemplary quality or reliability fail candidate population that requires more stress test during future sort stage testing.

As mentioned previously, hitherto known techniques would consider IC's with tests containing outliers, test results trending in one direction or marginal test results as failures and consequently discard the "outlier" devices, with the inevitable result of reducing yield score. In contrast, in accordance with the various embodiments of the invention discussed above, the population of outliers is only classified as "fail candidate" and as such is subjected to additional stress tests and only if the "outlier" device or module fails the additional stress test(s) it will be classified as "fail". If, on the other hand, it passes the additional stress test sequences it may proceed to the succeeding manufacturing stages and eventually delivered to the customer as a good IC. The net effect would then be that the yield score improves.

It should be noted that whilst generally outliers are characterized by 6 sigma deviation this is by no means binding and accordingly lower or higher deviation degree may apply, depending upon the particular application.

Those versed in the art will readily appreciate that the description above with reference to detecting outliers is a non limiting example of dynamic backward analysis technique that is applicable in accordance with the invention.

In accordance with certain embodiments, the backward analysis (the terms backward analysis and feed backward are used interchangeably) is used exclusively or in accordance with certain embodiments in addition to the feed forward technique discussed in detail above.

In accordance with certain embodiments the feed backward mechanism is not confined to semiconductor devices, but rather it may apply to at least one module of a semiconductor device, all as discussed in detail above with reference to the feed forward embodiments.

In accordance with certain embodiments, the outliers may extend to one or more semiconductor units (device or module(s)) in a wafer, or in certain embodiments to one or more wafers in a lot or in accordance with certain embodiments to one lot or more of a product, or in accordance with certain embodiments, certain combinations thereof, all as discussed in detail above with reference to the feed forward mechanism.

In accordance with certain embodiments the feed backward mechanism may be applied at the final stage when the devices are packaged whilst tracing the location of the corresponding die in the wafer (during sort) or at earlier stages, all as discussed in detail above. Insofar as final stage is concerned, there is generally no need for die tracing, seeing that the same identified outliers (at final stage) will be subjected to the additional stress testing.

Note that for realizing the re-test of the so identified outlier, known per se techniques may be used. For example, in sort stage a so called re-test or re-probe technique is used for applying the stress test sequence to the identified outlier devices. For final stage, considering that the devices are tested one at a time, whenever a device is classified as an outlier, it is normally subjected to the additional stress test sequences.

After applying the stress test, the units (devices/module (s)) that failed, are discarded and will not proceed to packaging and final stage testing. The remaining semiconductor devices that pass the stress test with a sufficient level of confidence are less susceptible to quality or reliability problems and therefore will proceed to the next manufacturing stage. The enhanced selective stress test applied in accordance with the various embodiments of the invention, obviate or minimize the costly burn-in stage (marked schematically as 120 in FIG. 1A) of detecting devices that are susceptible to quality or reliability problems.

Having described various embodiments of the invention concerning identification of distinct populations in feed forward and or feed backward mechanisms, there follows a description of a comprehensive sequence of operation in accordance with certain embodiments of the invention (with reference to FIG. 7A) focusing also on the procedure of associating appropriate test flow(s) to the so determined quality or reliability fail populations.

The first step 700 in the process involves the identification of quality or reliability fail candidate populations as discussed in detail above.

The next step (701), is the calculation and association of a test flow (that includes a stress test sequence) to each one of the specified populations. This will be further elaborated below with reference to FIGS. 9 and 10.

The stress test sequence applied to the specified fail candidate populations includes at least one test with increased duration compared to the duration of a test applied to other population. Thus, as exemplified with reference to FIG. 3A, the type 'A' dice have a stress test sequence that includes a given test (say, injection of given test vector(s) or pattern(s)) to certain or all inputs of a device) of longer duration than identical or similar test applied (or applicable) to the normal dice (residing, e.g. in the same die 304 and/or possibly in other wafer). In other words, the latter example means that the duration of the vector (e.g. the vector length) would be longer than a vector that is injected to a device belonging to a normal population.

There follows a few non-limiting examples of stress tests of longer and shorter durations, exemplified for the non-limiting case of stress test vector(s). Thus, by way of non-limiting example the shorter vector applied to the other population 304 can be a prefix of a vector applied to the devices of a first fail candidate population 301. In accordance with another non-limiting example, the longer vector applied to the first fail candidate population 301 can be a repetition (twice or more) of a vector applied to the devices of the other population 304. In accordance with another non-limiting example, the longer vector applied to the first fail candidate population 301 is different to the vector applied to the devices of the other population 304. In accordance with another non-limiting example, the longer vector applied to the first fail candidate population 301 can be a concatenation of two or more sub-tests compared to a test vector applied to the devices of the other population 304. The invention is not bound by anyone of the specified examples.

The test sequence may possibly further include other tests, e.g. at least one with different voltage and/or different temperature and/or different frequency. By a non-limiting example, an increased frequency means that devices that belong to a given fail candidate population will receive a test sequence that includes injecting a test vector at a given frequency—higher or lower (which the case may be) compared to the frequency of the same test vector that is injected to devices that belong to a normal population.

One non-limiting manner of realizing application of higher temperature to, say distinct dice in a wafer is by placing the wafer on the "chuck". This chuck is heated to a specific temperature. A very simple mechanical object can "separate" the heat according to areas. Consider—rings, pizza slices, etc.

Figure 7A:
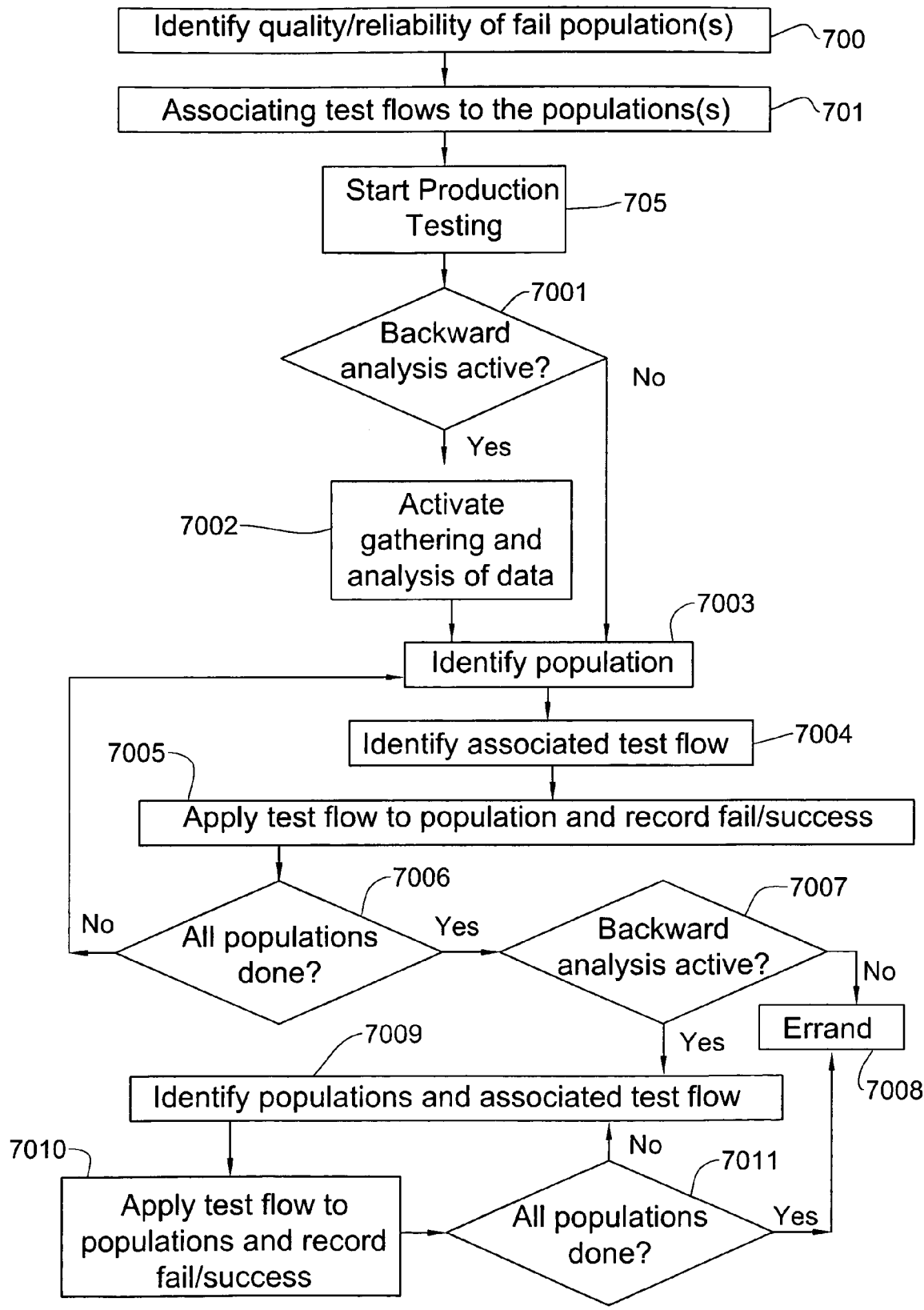
FIG. 7A illustrates schematically a flow diagram of a sequence of operation in accordance with an embodiment of the invention.
Figure 7B:
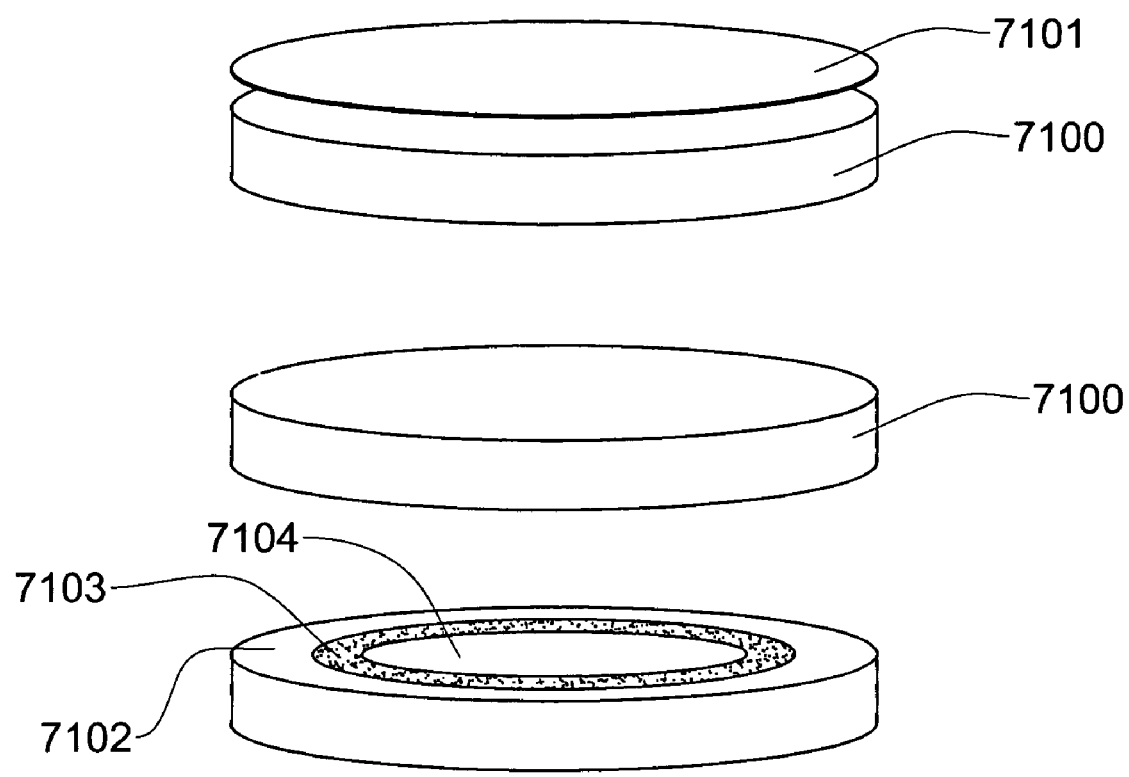
FIG. 7B illustrates schematically a mechanism for heating a wafer to different temperatures, in accordance with an embodiment of the invention.

For a better understanding of the foregoing, attention is drawn to FIG. 7B illustrates schematically a mechanism for heating a wafer to different temperatures, in accordance with an embodiment of the invention. Thus, as shown a chuck 7100 is heated in a uniform manner and accordingly when a wafer 7101 is placed on the chuck 7100 it will be heated to a uniform pre-selected temperature. In accordance with a different scenario it is required to heat different portions of the wafer to correspondingly different temperatures. The specified different areas signify distinct fail candidate populations that are subjected to different stress test sequences that include applying the test sequences at respective different temperatures. Thus, for example the chuck 7100 is sliced to distinct rings 7102, 7103 and 7104. The implementation provision of heating/cooling mechanism to distinct parts of the chuck is generally known per se and will not be expounded upon herein. Each of the specified rings is subjected to a different temperature. For example, the inner part 7104 may be an ambient temperature applied to a normal population (i.e. dice placed at the wafer center). A higher (or lower) temperature may be applied to the outer ring 7103 which will result in applying test sequences in higher/lower temperature to dice (belonging to a fail candidate population) placed at corresponding location in the wafer. And finally, a different (higher or lower) temperature may be applied to the most outer ring 7102 which will result in applying test sequences in higher/lower temperature to dice (belonging to yet another fail candidate population) placed at corresponding most outer location in the wafer.

The invention is of course not bound to the specified "ring" implementation for provision of different temperatures to different populations.

Having completed a preliminary calibration phase of identifying populations and associating thereto test flows, there follows a sequence of operation 7000 in accordance with an embodiment of the invention.

In operation, it is first inquired whether the backward analysis mode is active 7001 and if in the affirmative, data is gathered and analyzed 7002 (during the sort operation) all as discussed in detail with reference to FIG. 6.

Regardless of whether data is gathered for feed backward purposes, data indicative of the tested population 7003 (e.g. population of dice designated 'A' in FIG. 3A) is loaded (from a database, say sort database 101) by the station controller (105 of FIG. 1A) and the handling equipment 108 is appropriately controlled for placing the DUT(s) 111 for testing.

Next, the associated test flow is loaded 7004 (from a database, say sort database 101) by the station controller (105 of FIG. 1A) and the test program (107) is updated for activating the ATE 106 for applying the test flow 7005 (according to the test program) to the devices of the population under consideration.

The failing/passing dice are recorded in an appropriate bin. This procedure is repeated until all populations are treated 7006 (e.g. populations 301, 302, 303 and normal population 304 [the latter is subjected to reduced stress test or not at all] of FIG. 3A).

In the case that the feed backward analysis is applicable 7007 and 7008 (e.g. identified outliers), the appropriate test flow is loaded and applied to the so identified populations 7010 until all populations are treated 7011, giving rise to the termination of the stress test sequence.

Note that the procedure of testing populations is not necessarily serial, namely testing all the dice of a given population and then the devices of the other population, etc. Attention is again drawn to FIG. 1B illustrating the possible serpentine manner of scanning the wafer (as illustrated by serpentine line 124). Assuming that the first population (with its associated test flow) is the '0' dice (e.g. 121) and that the second population (with its associated test flow) is the '1' dice (e.g. 122) and the other population (with its associated test flow) is the 'blank' dice (e.g. 123). As readily shown, the scanning would prescribe the loading and incorporating in the test program the test flow that corresponds to the '0' dice, all as described in detail with reference to FIGS. 1A and 1B, above. The dice are tested until '0' die 130 is encountered. When the scanning proceeds to die 123 (belonging to the 'blank' population), the appropriate test flow is loaded and the TP is updated for testing dice 123 and 132. Next die 133 is encountered and the TP is updated again with the test flow that corresponds to the '0' dice. This switching of test flows according to the tested dice is continued (e.g. switching between the test flow that corresponds to blank dice (die 134) and then the test flow that corresponds to '0' dice (die 135), and finally the test flow that corresponds to '1' dice (die 136). Note also that if outliers are detected (in the course of scanning), the appropriate test flow is loaded and applied (e.g., in a re-probing technique) to so detected outliers. Note that in the case of touchdown scanning, where a few dice are tested in parallel, it is possible to load different TPs to different dies if the latter belong to different populations.

Those versed in the art will readily appreciate that the invention is not bound by the specific sequence of operations described with reference to FIG. 7A and likewise not by the corresponding system architecture of FIG. 1A Obviously, one or more of the various possible embodiments discussed above may apply, e.g. (including but not limited to):

(i) In accordance with certain embodiments the testing may apply to at least one module of a semiconductor device, all as discussed in detail above.

(ii) In accordance with certain embodiments, population (s) may extend to one or more semiconductor unit(s) (device or module(s)) in a wafer, or in certain embodiments to one or more wafers in a lot or in accordance with certain embodiments to one lot or more of a product, all as discussed in detail above.

(iii) In accordance with certain embodiments the testing mechanism may be applied at the final stage when the devices are packaged whilst typically (although not necessarily) tracing the location of the corresponding die in the wafer (during sort) or at earlier stages, all as discussed in detail above.

The invention is not bound by the specified examples (i) to (iii), discussed above.

Having described a sequence of operation with reference to FIG. 7A, it is recalled that each quality or reliability fail candidate population is associated with a test flow that includes a test stress sequence. The description below elaborates on various embodiments of the so used stress sequences.

Thus, as specified above the test sequence includes tests of longer duration compared to test applied to a population other than the fail candidate. (e.g. a test applied for 200 msec, to, say, population 'A' 301 compared to 100 msec to, say, regular population 304). If desired, the test flow may further include one or more of the following tests: different voltage (say +30% compared to the voltage defined by the device's operational specification). The higher voltage can be applied to the device's Vdd and/or to any other relevant input.

If further desired the test sequence may be performed at different temperature conditions compared to the temperature defined by the device's operational specification. If further desired the test sequence may include a test of different frequency compared to that defined by the device's operational specification.

In the specific case of memories (whether as a device or module(s) in a device), the longer duration may include larger number of test cycles, say larger number of read commands and/or larger number of write commands, or e.g. in the case of flash memory larger number of program/erase commands. Note that the invention is not bound by the specified examples and obviously not by any specific memory type and or commands. After applying the sequence of operation as described by way of specific embodiment with reference to FIG. 7A, certain devices or modules which are susceptible to quality or reliability problems are classified as "failed" (whether during the sort or final stage which the case may be), and obviously will be discarded. One of the benefits of identifying and utilizing an optimized stress test flow at sort and/or final test for each IC is that burn-in could possibly be reduced or eliminated for a given IC product, thus reducing overall testing cost.

Figure 8:
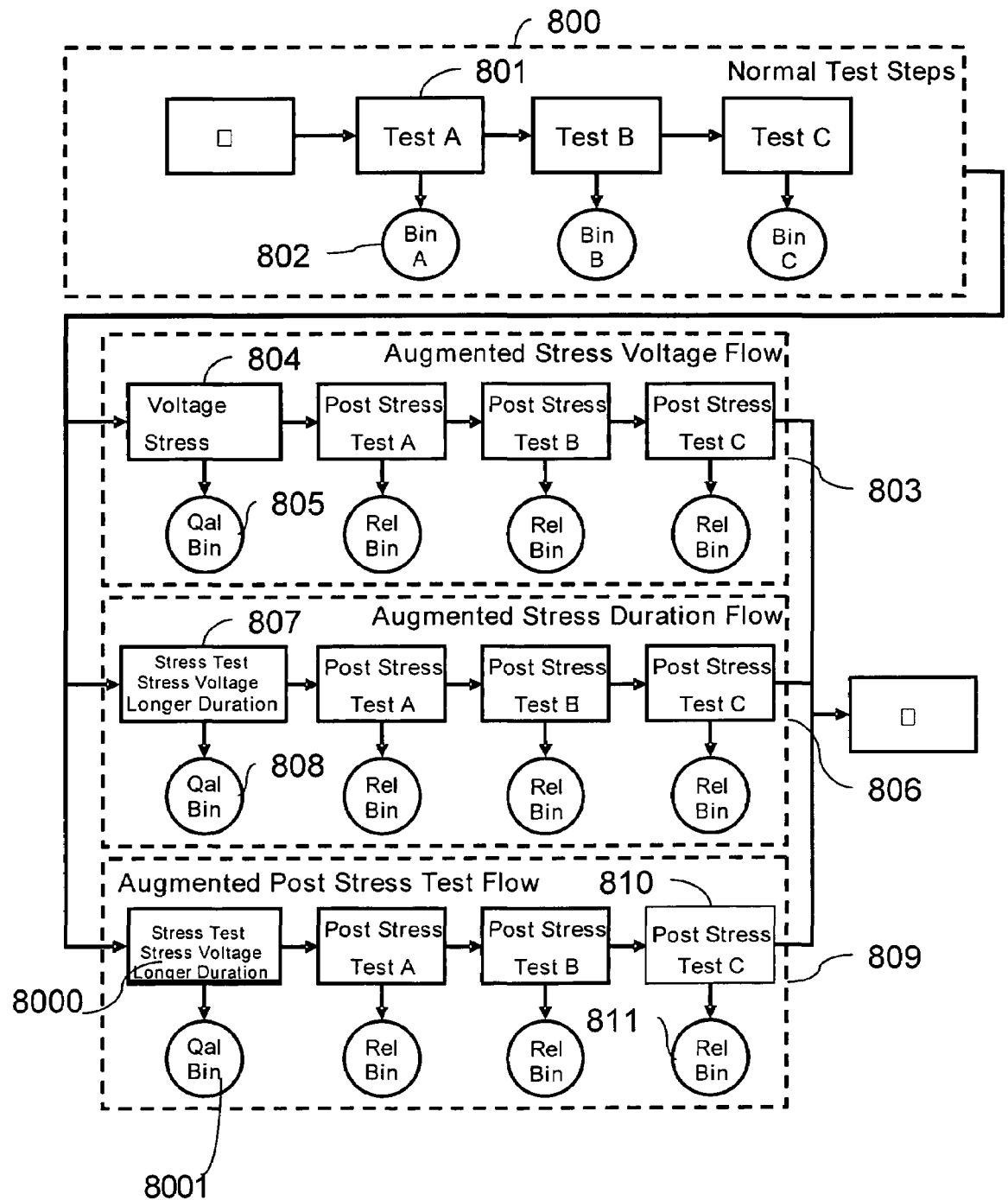
FIG. 8 is a flow diagram showing a quality or reliability test sequence, in accordance with an embodiment of the invention.

Bearing this in mind, attention is drawn to FIG. 8 showing a flow diagram of a quality or reliability test sequence, in accordance with an embodiment of the invention. As shown, at the onset, a set of conventional (non-stress) test steps 800 are executed (during sort stage) consisting of several sub-tests such as Test A 801 each of which performs a binning decision such as Bin A 802 if the device fails the test.

The specified pre stress sub-tests can be e.g. one or more of the following: continuity, opens, shorts, various functional tests, stuck at scan, at-speed scan.

Next, there follows the stress test phase wherein distinct test flows are applied to distinct populations, as described with reference to FIG. 7A above. In FIG. 8, three test sequences are applied 803, 806 and 809 each including a test flow that includes a stress test sequence. 803 is directed to, say the other population (e.g. 304 in FIG. 3), whereas 806 and 809 are directed to, say, the 'fail' populations (e.g. 301 and 302, respectively).

For instance, the test flow 803 includes a stress test sequence 804 that includes a an increased voltage compared to that defined by the operating voltage specification of the device (say, +30% voltage) followed by post stress tests A, B and C. The stress test duration is, say 50 ms). It should be noted already at this stage that the post stress tests operate under normal conditions, all as will be explained in greater detail below.

Reverting to the stress test sequence 804, the binning decision of failed dice is indicated in 805.

The second test flow 806 includes a stress test sequence 807 that includes a test of longer duration and increased voltage (e.g. +40% voltage level for 200 ms) followed by post stress tests A, B and C that will be discussed in greater detail below. The binning decision of failed dice is indicated in 808. The population that corresponds to the second test flow 806 can be composed of dice with reliability problems due to yield common failures (such as die designated as 301 in FIG. 3A).

The third test flow 809 includes a stress test sequence 8000 that includes a test of longer duration and increased voltage (e.g. +30% voltage level for 100 ms) followed by post stress tests A, B and C that will be discussed in greater detail below. The binning decision of failed dice is indicated in 8001. The population that corresponds to the third test flow 809 can be composed of dice with reliability problems due to customer common failures (such as die designated as 302 in FIG. 3A).

For illustrative purposes only, had the stress test flows not been used, the current reliability in terms of DPPM for the product being tested would be for example 540 DPPM, whereas after using the specified stress test sequences (targeted to the designated populations) the reliability in terms of DPPM for the product being tested using the augmented reliability flow is reduced to 290. This improved result is accomplished due to the fact that many devices that would otherwise be revealed as "faulty devices" at (costly and lengthy) burn-in stage, or later at final test stage or after having been shipped to customers, would now be classified as "faulty devices" in response to applying the stress test sequences, and consequently be discarded already at this early sort stage (and/or final stage which the case may be).

The invention is of course not bound by these particular examples which are provided for illustrative purposes only.

It is therefore noted that as described previously, there may be reliability concerns on certain semiconductor devices originating from various factors such as process characteristics, yield common failures, customer common failures or other issues. These concerns are not addressed by using a pre-defined set of tests and stresses. In other words, certain devices may need more or less testing and stressing to optimize stress flow steps, thereby optimizing product reliability. Many semiconductor companies report DPPM rates of 200 to 500 based on their products and struggle to lower those rates. The method and system in accordance with certain embodiments of the invention will augment semiconductor reliability by determining effective stress flow comprised of an optimized set of quality or reliability stress sub-tests for at least one member in a group that includes: IC lot, wafer, areas of a wafer, wafer die, dice within the same lithography exposure, dice with the same location across lithography exposures, packaged device and functional modules within an IC. The net effect is the use of a best fit stress test flow for each unit resulting in reliability augmentation which increases product reliability in terms of lower DPPM. The method and system in accordance with certain embodiments of the invention of the invention can also be used to reduce or eliminate burn-in on IC's, thus reducing cost.

Having described a sequence of operation in accordance with certain embodiments, attention is reverted to FIG. 7A, and in particular to step 701 of associating the test flows to the so identified populations which will now be described in greater detail with reference also to FIGS. 9 and 10.

Figure 9:
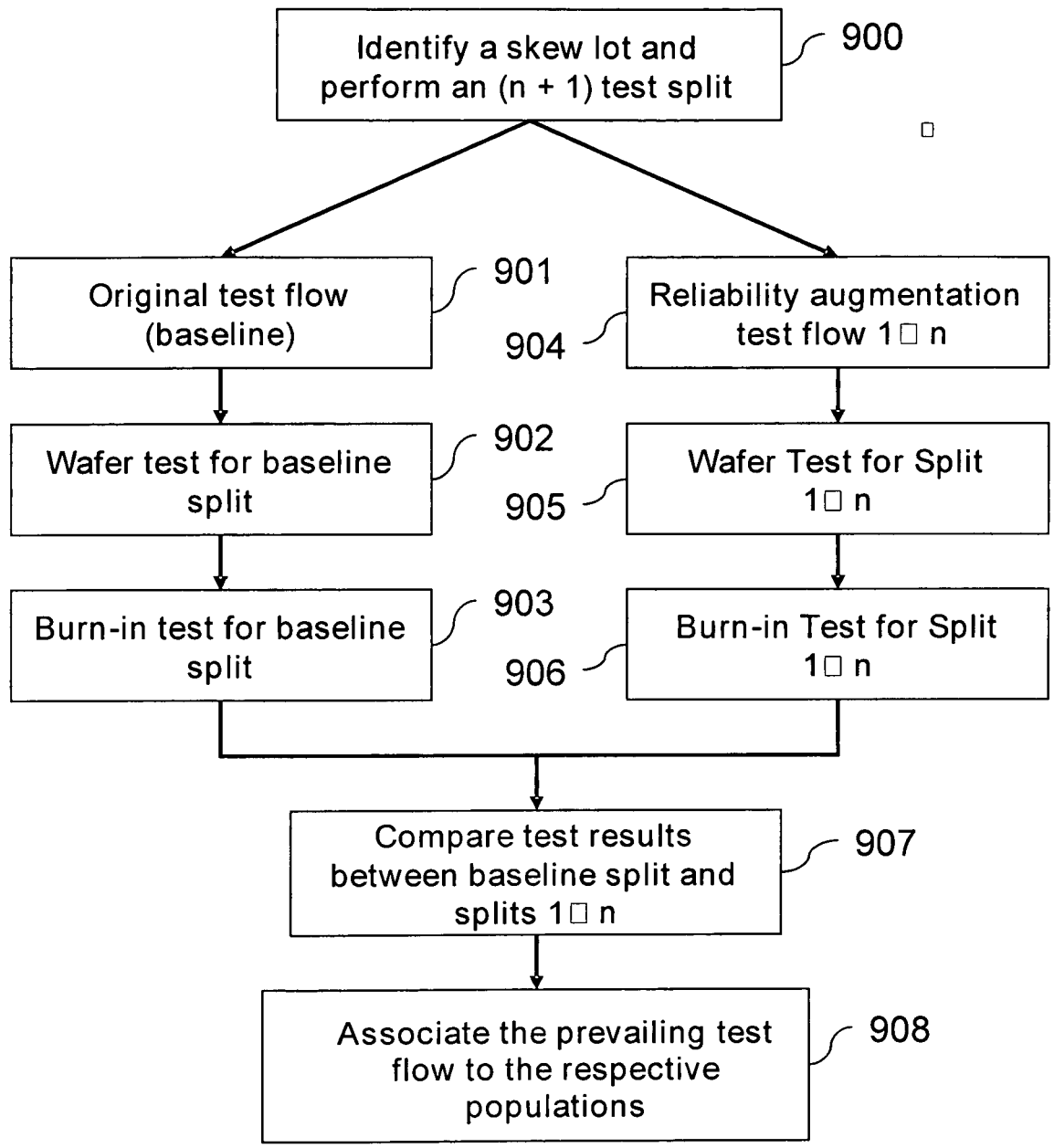
FIG. 9 is a flow diagram illustrating a sequence of operations for associating test flows to distinct quality or reliability fail candidate populations, in accordance with an embodiment of the invention.

Accordingly, attention is directed to FIG. 9, showing a flow diagram of a sequence of operation for associating test flows to distinct quality or reliability fail candidate populations, in accordance with an embodiment of the invention.

The flow diagram shows an example of an automated process to determine the best fit reliability augmentation for a specific population using a skew lot, in accordance with an embodiment of the invention. Note that the invention is not bound by the use of skew lot.

As is well known, skew lot is generally defined in the semiconductor industry as a group of wafers or packaged IC's that collectively exhibit the full window of allowable variation (typically +/−3 Sigma) of at least one Fab process parameter for the Fab process being used to manufacture the wafers. Examples of Fab process parameters are transistor channel length/width, gate capacitance, saturation current, poly gate critical dimension and gate threshold voltage. A skew lot is typically created by purposely inducing maximum allowable process parameter shifts during wafer fabrication. A skew lot can also be discovered by reviewing test results from multiple lots to find a lot that exhibits the full window of allowable variation. In this connection, attention is drawn to FIG. 10A, illustrating a table 1000 elaborating 3 skew lots, the first identifying Fast material (characterized by "poly" target −3 Sigma), the second identifying Typical material (characterized by "poly" target) and the third identifying Slow material (characterized by "poly" target +3 Sigma). In the example Fab lot depicted in the Fab skew lot definition table 1000, the devices within the lot exhibited variation of a specific parameter, namely a parameter that correlates to processor speed, and the distribution of the devices within the lot were classified as follows: fast material, typical material and slow material.

Once a skew lot has identified semiconductor units (devices, or modules(s) which the case may be) with similar characteristics (i.e. belonging to the same population) all as described in detail above, these units are split equally between n test flows 900. The n test flows constitute the repertoire of available stress test flows which all devices that belong to a given population will undergo and the results will be compared in order to identify the prevailing test flow which will be associated to this particular population.

The procedure described with reference to FIG. 9 is performed in respect of each population distinctly. A population may be defined for instance as dice of 'A' type (in FIG. 3A). This means that the specified population will be subjected to its associated test flow for the skew of slow material and for the skew of the typical material and also for the skew of the fast material.

Other populations may likewise be defined for 'B' type dice, 'C' type dice and normal dice.

Note that the invention is not bound by the use of skew lots as a factor for determining a population for testing.

At the onset, a baseline (reference) test flow 901 is invoked per selected population (say 'A' dice for fast material). It includes wafer test for the baseline 902 which uses the original test program flow (without invoking any additional stress test) and burn-in test for the baseline split 903. The base line flow provides a reference of "units-fail" score in the burn-in phase. For instance, the percentage of failed unit detected in the burn-in stage 903. This procedure is repeated for each one of the specified populations and the appropriate reference test results are logged, per population.

Obviously, it is expected that the logged "units fail" score after applying the prevailing test flow (with the stress test sequence) will be improved (compared to the "reference" test) since some (or hopefully most) of the units which would otherwise be detected as failed units during the costly and long burn-in process (or afterwards when shipped to the customers) will now be revealed at an earlier stage (e.g. sort or final stage, whichever the case may be), due to the augmented reliability test technique offered in accordance with the various embodiments of the invention.

To this end, a 904 selected test flow from the n possible test flows is applied to a given population 905 (say the 'A' dice for slow material). The "unit fail score" is logged (e.g. the percentage of failed units) and then the same wafer is subjected to burn-in stage 906 and likewise the "unit fail" score is logged.

Then the procedure is repeated in respect of the other test flows, logging the corresponding results.

Next, the baseline split test results are compared to the reliability test splits (1 . . . n) 907 and the prevailing test is determined according to a decision criterion. A non-limiting manner of comparison between the results and deciding on the prevailing flow will be exemplified with reference to FIGS. 10A-10B.

Finally one (out of n) reliability flow is chosen and associated to the specified population 908.

Turning now to FIGS. 10A-10B, there are shown two tables for further exemplifying the flow chart sequence of FIG. 9.

FIG. 10 contains two tables in 10A (discussed above) and 10B.

In this example, assume that processor speed is the reliability issue of interest. Table 1001 describes an example stress flow testing experiment for n devices that constitute a given population using various combinations of stress voltage and stress duration. The invention is of course not bound by this example and other variants can apply, e.g. additional stress test parameter(s) in addition of instead of the above. In accordance with another example the constraint of modifying only one parameter at a time does not necessarily apply, etc.

Turning now to table 1001, first the selected population of devices (say 'A' dice in wafer 300 of FIG. 3) is tested with the original baseline stress flow (duration 50 msec and an additional voltage, say Vdd compared to the operating voltage specification of the device). Next, similar groups of n devices (e.g. 'A' dice from another wafer in the same lot) are tested using various reliability test flows using combinations of stress voltage, stress duration. For example, in the first stress flow (second line in table 1001) longer duration is selected (100 msec) and increased voltage (+40% compared to the operating voltage specification). Another test flow in the repertoire (third line in table 1001) stipulates test sequence with test of longer duration (100 msec) and increased voltage (+30%). The procedure is repeated for all stress test sequences of the repertoire of which a few are indicated for illustrative purposes only in table 10B.

During each of the specified applications of stress test sequences, failing (bad) reliability bins are captured and stored for each device and the percent failures are calculated and logged. After all the dice in the specified population are stress tested, those that managed to pass the sort stress test are subjected to burn-in testing which accelerates future reliability failures. The failure rates during the subsequent burn-in phase are also calculated and logged.

In accordance with certain embodiments, identification of the best fit reliability stress flow involves comparing the failing reliability bins and percent failures from the stress flow testing experiment to the failing reliability bins and percent failures of the burn-in process. In this example the baseline reliability stress flow at wafer test had yield fallout of 3%. In other words the original baseline stress flow at wafer test detected 3% of the failures directly related to the reliability issue of interest and burn-in detected an additional 5% of those failures.

The goal of the experiment is to identify prevailing test flow. A possible non-limiting decision criterion can be detecting the highest number of failures at sort test and the lowest number of failures at burn-in. In this example the stress flow that appears to qualify is test No. 4: Additional stress voltage+duration which at wafer test detected 6% (tested "unit fail" score) of the failures directly related to the reliability issue of interest and burn-in detected 1% (tested burn-in "unit fail" score). In this case the stress flow with additional stress voltage and duration as prescribed Test No.

4 is the optimal reliability stress flow and therefore this selected test flow is associated to the specified population (701 in FIG. 7A). As specified, one of the benefits of identifying and utilizing an optimized stress test flow at wafer test or package test for each IC is that burn-in could possibly be reduced or eliminated for a given IC product, thus reducing overall testing cost.

Table 10B illustrates a specific repertoire using only duration and voltage. This is of course not binding and accordingly other parameters can be used, e.g. duration, and one or more of the following: voltage, frequency and temperature.

Regardless of the embodiment under consideration, whenever desired, at least one of the test flows further includes a post-stress sequence that is applicable to the corresponding quality or reliability fail candidate population. A typical post stress test may include applying one or more of the following exemplary list of tests: various functional tests, stuck at scan, at-speed scan, leakage, icc, iddq.

For example with reference to FIG. 3, the 'A' dice may be subjected to a test flow that includes their designated stress test and a subsequence post stress test sequence. After applying the stress test and logging the units (devices/module(s)) that failed, there follows a subsequent post test sequence logging also the devices which passed the stress test but failed the post test sequence. The specified devices which failed the post test sequence will be discarded, thereby packaging and shipping (the remaining) semiconductor devices that are less susceptible to quality or reliability problems whilst obviating or minimizing the costly burn-in phase of detecting devices that are susceptible to quality or reliability problems.

In accordance with certain embodiments, the population is not necessarily bound to geographic area. Reverting to the example of FIG. 10, as may be recalled a first population is composed of dice 'A', the second is composed of dice 'B' etc. As may be recalled, the test flow associated with the dice 'A population was applied for both skew slow material, typical material and fast material.

In accordance with certain embodiments the population is not defined only by geographic consideration (such as dice in area 301, etc.), but rather on additional one or more parameters. By way of non-limiting example, the population may be defined in accordance with the geographic consideration and the skew parameter. Accordingly by this non-limiting example a first population will be 'A' dice for skew of slow material (associated with a first test flow). The second population would be 'A' dice for skew of typical material (associated with a second test flow), a third population would be 'B' dice for skew of slow material (associated with a third test flow), etc.

In accordance with a second aspect of the invention, the invention concerns utilization of pre-stress and post-stress testing.

Figure 11:
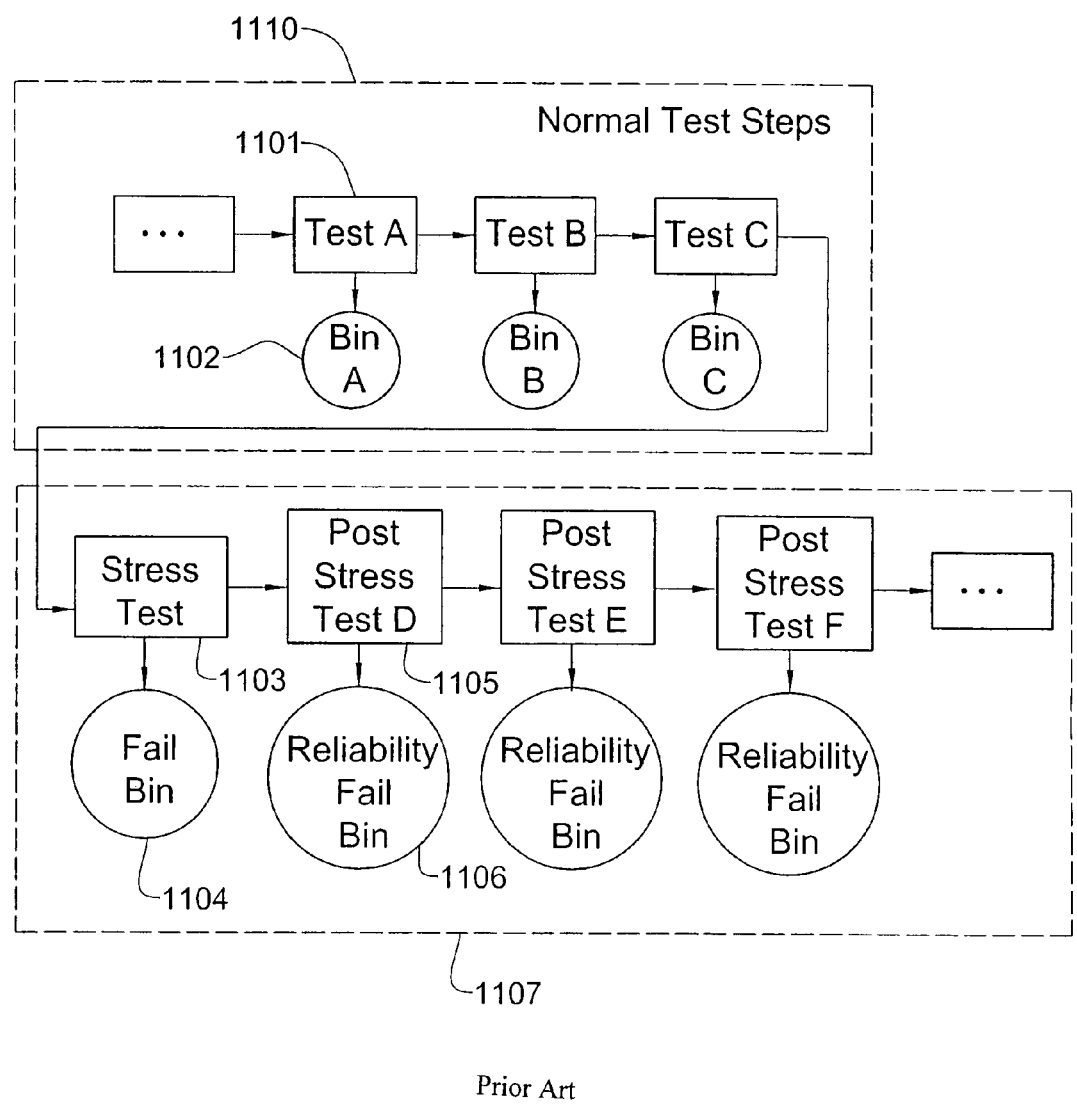
FIG. 11 is a flow diagram showing conventional quality or reliability test flow as known in the prior art.

Attention is first directed to FIG. 11 showing a flow diagram of a conventional quality or reliability test flow, in accordance with prior art.

As is well known, device quality or reliability is usually tested through a set of sub-tests called a stress flow. First, a set of normal (pre-stress) test steps 1100 are executed followed by a set of stress flow test steps 1107. The idea is to test the device under normal operating conditions and then stress the device with stress test e.g. 1103, say higher voltage levels (e.g. +30%). The conventional test steps 1100 may consist of several sub-tests such as Test A 1101, each of which performs a binning decision, such as Bin A 1102 if the device fails the test. Typical, yet not exclusive, examples of a normal test sequence is at least one of the following tests: continuity, opens, shorts, various functional tests, stuck at scan, at-speed scan.

During the succeeding stages 1107, stress flow test sequence 1103 is activated which makes a quality bin decision 1104 if the device fails the test. Following the stress sub-test 1103, it is customary to subject the device to several post stress tests such as post stress Test D 1105, which makes a binning decision 1106 if the device fails the test. The set of post stress sub-tests may be the same or different from the set of normal pre-stress test steps 1100. It is important to note that in a typical quality and reliability test flow all devices receive the identical number and type of post stress tests. Namely, all the devices of a given product will receive the same pre-stress sequence (say: A, B and C) as well as the same post stress sequence, say D, E and F. A typical post stress test may include at least one of the following: various functional tests, stuck at scan, at-speed scan, leakage, icc, iddq.

One of the shortcomings of this approach is that all devices are tested with the identical stress flow which utilizes pre-defined deterministic decisions, therefore the opportunity to increase product reliability by customizing the pre-stress and post stress tests per population is not met.

Figure 12:
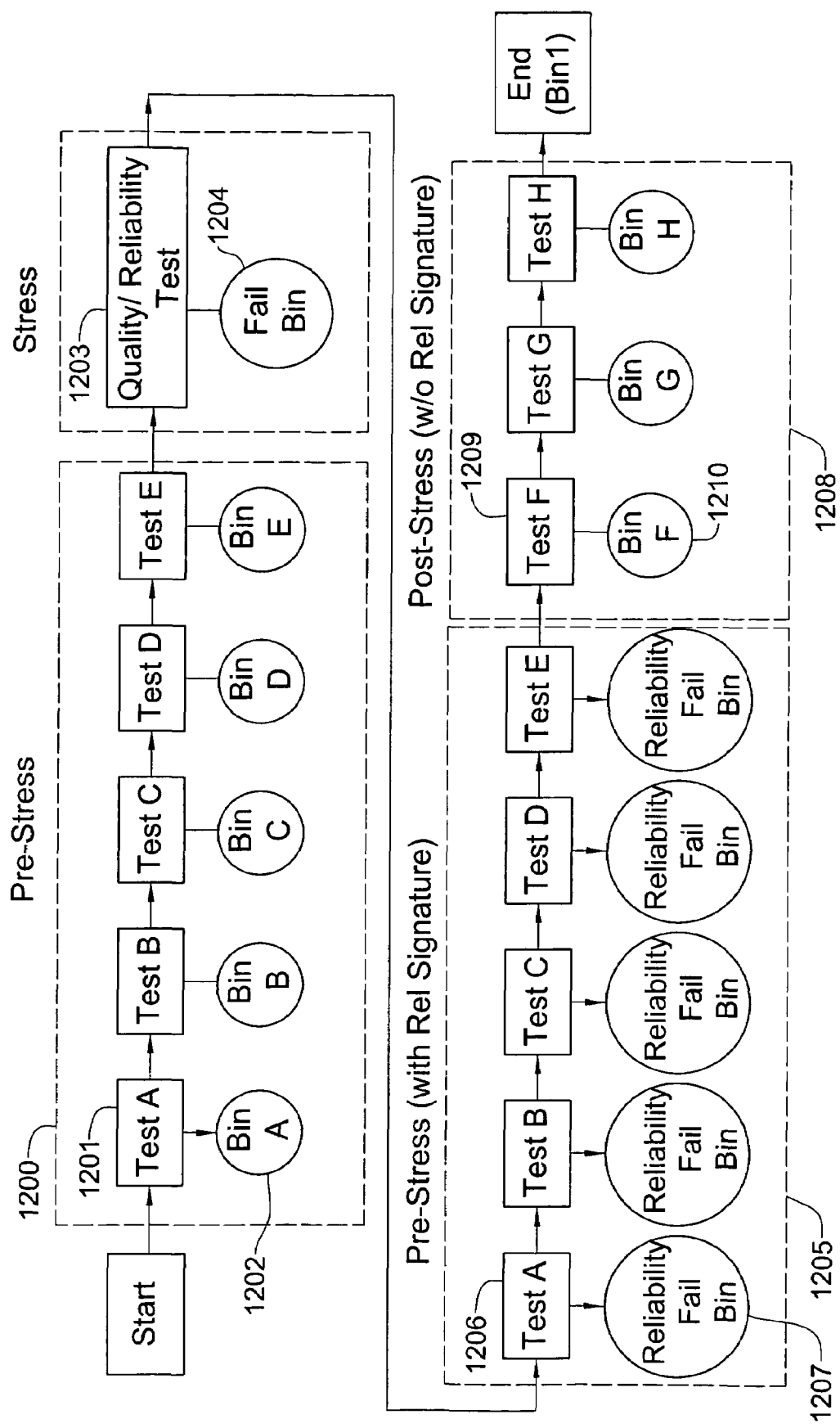
FIG. 12 is a flow diagram showing a quality or reliability test flow in accordance with a certain embodiment of another aspect of the invention.

Bearing this in mind, attention is drawn to FIG. 12 showing a flow diagram of a quality or reliability test flow in accordance with certain embodiments of another aspect of the invention.

First, a set of normal pre-stress test steps 1200 are executed consisting of several sub-tests such as Test A 1201 (and subsequent tests B-E), each of which performs a binning decision such as Bin A 1202 if the device(s) fails the test. The normal pre-stress tests may include at least one of the following non-exclusive list: continuity, opens, shorts, various functional tests, stuck at scan, at-speed scan.

Next, a set of quality/reliability test flow is performed 1203 which, as is well known, aims at identifying in-advance devices which are susceptible to failure. In the example of FIG. 12, there is shown a test 1203 which performs a binning decision 1204 if the device(s) fail(s) the quality or reliability tests. Note that in accordance with certain embodiments of this aspect of the invention, the quality or reliability tests can be performed according to prior art (e.g. performed uniformly on all devices), or in accordance with certain other embodiments, the quality or reliability tests are performed in accordance with any of the teachings of the first aspect of the invention.

Next, a set of normal post-stress test steps 1205 are executed consisting of several sub-tests such as Test A 1206, each of which performs a binning decision such as Bin A 1207 if the device(s) fails the test. The normal post-stress tests may include at least one of the following non-exclusive list: various functional tests, stuck at scan, at-speed scan, leakage, icc, iddq.

In accordance with certain embodiments of the second aspect of the invention, there are determined at least two distinct populations of semiconductor units that are subjected to the pre-stress and post-stress sequence. The determination of the specified populations can be, e.g. in accordance with any of the teachings described with reference to the first aspect of the invention described above.

Having determined at least two populations, each of the populations is subjected to a test flow that includes pre-stress, stress, and post-stress sequences, of the kind described with reference to FIG. 12. Note that the test flow for the first population includes identical pre-stress test sequence and post stress test sequence. This is readily shown in FIG. 12, where the same sequence (e.g. pre-stress Tests A, B, C, D, and E 1200) is provided also as a post stress test (e.g. Tests A, B, C, D, and E 1205).

The second population will also be subjected to identical pre-stress sequence and post-stress sequence, however, obviously different than that of the first population. Thus, for example, if the pre-stress and post-stress test sequence for a first population is A, B, C, D, E, then for a second population the sequence used as a pre-stress and post-stress sequence would be, e.g. B, C, E, F.

The advantage of using a unique pre- and post stress sequence per population is by adapting the most suitable sequence of pre- and post stress tests per population. The manner of associating a test flow per population can be realized, e.g. in accordance with the teachings of the various embodiments described with reference to FIGS. 9 and 10.

It is also recalled that the unique pre-stress and post-stress sequence per population can be used with conventional quality or reliability stress test techniques or in accordance with any of the embodiments discussed above with reference to a first aspect of the invention.

Reverting now to a distinct population, as specified above, it is subjected to an identical pre-test sequence and post-stress sequence. If a given device (in the population) passes a pre test sequence (including, say test A 1201) and then passes the quality or reliability test 1203 then, on the face of it, the device is less susceptible to quality or reliability problems when shipped to the customer (after undergoing the subsequent packaging and final test). At this stage, the device should pass the post stress test (including test A 1206) since it has already passed the same sequence as a pre-stress test. Indeed, those devices which are fault-free are likely to pass the identical post-stress test sequence, however, those that are vulnerable to reliability failures (after having been "pressurized" by the stress test sequence) may now fail (namely have a reliability fail signature—say, reliability fail bin 1207) if being subjected to the same sequence that they already passed before having been "pressurized" through stress-test sequence.

The net effect would be that additional fail candidate devices can be traced during sort stage (using the approach of the second aspect of the invention), improving the DPPM and reducing or obviating the need to utilize the costly and lengthy burn-in procedure for detecting faulty devices.

Note that whereas the description above referred to identical pre-stress test sequence and post stress test sequence (e.g. A, B, C, D and E in the example above), this is not necessarily binding. Thus, at least one of the pre-stress tests and the post-stress tests may be identical. For instance, for the pre stress test sequence A, B, D, E and the post stress sequence B, C, F, S the test B serves as the identical test for the pre-stress and post stress sequence. Thus, if a device that already passed test B as a pre-stress test, fails the same test at post stress, it indicates that this device is susceptible to a reliability problem.

In accordance with certain embodiments, at least one of the test flows further includes additional post-stress sequence that is applicable to a corresponding population. The additional post-stress test need not be part of the pre-test sequence. Thus, as shown in FIG. 12, additional post-stress tests 1208 are applied to a given population, such as tests F (1209) with binning decision 1210, G and H. As shown this F, G, H post-stress test sequence was not used during the pre-stress sequence.

In accordance with certain embodiments, the system architecture described, for example, with reference to FIG. 1, is configured to carry out the pre-stress test, stress test and post-stress test sequences in accordance with the various embodiments of the second aspect of the invention.

Those versed in the art will readily appreciate that the gathering and analyzing of data for identifying distinct populations may be carried out in accordance with the various embodiments described with reference to the first aspect of the invention, described above. This includes and is not limited to applying feed forwards and/or feed backward processing as described in detail above.

Those versed in the art will readily appreciate that the various embodiments described with reference to semiconductor devices, may apply if desired also (or in lieu) to semiconductor module(s), all as described in detail with reference to the first aspect of the invention.

Those versed in the art will readily appreciate that the various embodiments described with reference to sort stage may be applicable also (or in lieu) to final stage, all as described in detail with reference to the first aspect of the invention, above.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

The present invention has been described with a certain degree of particularity, but those versed in the art will readily appreciate that various alterations and modifications may be carried out without departing from the scope of the following claims:

The invention claimed is:

1. A method for augmenting quality or reliability of semiconductor units, comprising:
  (a) providing at least two populations of semiconductor units that are subject to quality or reliability testing; the at least two populations including at least one quality or reliability fail candidate population and at least one other population;
  (b) associating test flows to the at least two populations; each test flow including a stress testing sequence; wherein the stress testing sequence for at least one of the quality or reliability fail candidate populations includes a stress test of increased duration as compared to a duration of a stress test in a test flow of at least one of the other populations; wherein the stress testing sequence for at least one of the other populations includes a stress test of increased voltage as compared to a corresponding operating voltage specification for a semiconductor unit of the semiconductor units; and
  (c) applying, within a sort testing stage, a corresponding test flow to each of the at least two populations and identifying any semiconductor unit which failed the stress testing sequence.

2. The method according to claim 1, wherein the semiconductor unit is a semiconductor device.

3. The method according to claim 2, wherein the semiconductor unit is a module within the semiconductor device.

4. The method according to claim 3, wherein the modules are at least one of a group that includes: a micro-processor, DSP, Memory, I/O, Specialty ASIC, Control, Analog, and RF.

5. The method according to claim 3, wherein at least one of the quality or reliability fail candidate populations extends to at least one module in a semiconductor device in a wafer within a lot that is subjected to sort testing.

6. The method according to claim 3, wherein at least one of the quality or reliability fail candidate populations extends to at least one module in all semiconductor devices of at least one wafer within a lot that is subjected to sort testing.

7. The method according to claim 2, wherein at least one of the quality or reliability fail candidate populations extends to at least one semiconductor device in a wafer within a lot that is subjected to sort testing.

8. The method according to claim 2, wherein at least one of the quality or reliability fail candidate populations extends to all semiconductor devices of at least one wafer within a lot that is subjected to sort testing.

9. The method according to claim 2, wherein the semiconductor device is a memory device and wherein the stress test of increased duration has a larger number of test cycles to be applied to the semiconductor device as compared to a number of test cycles of a stress testing sequence of at least one of the other populations.

10. The method according to claim 9, wherein the memory device has memory modules, and wherein a memory module is selected from a group that includes: at least one row of cells or portion thereof, at least one column of cells or portion thereof, and an array of cells defined by an intersection of at least two rows and at least two columns, and wherein the stress test of increased duration has a larger number of test cycles to be applied to at least one of the memory modules as compared to a number of test cycles of a stress testing sequence of at least one of the other populations.

11. The method according to claim 1, wherein the stress testing sequence for at least one of the quality or reliability fail candidate populations further includes, a stress test with an increased voltage as compared to a corresponding operating voltage specification for a semiconductor unit of the semiconductor units.

12. The method according to claim 1, wherein the stress testing sequence for at least one of the quality or reliability fail candidate populations further includes, a stress test operable under a different temperature as compared to a corresponding operating temperature specification for a semiconductor unit of the semiconductor units.

13. The method according to claim 1, wherein the stress testing sequence for at least one of the quality or reliability fail candidate populations further includes, a stress test operable under a different frequency as compared to a corresponding operating frequency specification for a semiconductor unit of the semiconductor units.

14. The method according to claim 1, wherein the associating test flows further includes, associating at least one test flow that includes a post-stress sequence with respect to at least one of the quality or reliability fail candidate populations; and wherein the applying, within a sort testing stage, further includes, at least one test flow that has the stress testing sequence and post-stress testing sequence with respect to at least one of the quality or reliability fail candidate populations for identifying any semiconductor unit which failed the post-stress testing sequence.

15. The method according to claim 1, wherein the associating test flows further includes, associating at least one test flow containing identical pre-stress and post-stress testing sequences with respect to at least one of the quality or reliability fail candidate populations; and wherein the applying within a sort testing stage, further includes, at least one test flow that includes a pre-stress testing sequence, stress testing sequence and post-stress testing sequence with respect to at least one of the quality or reliability fail candidate population for further identifying any semiconductor unit which failed the post-stress testing sequence.

16. The method according to claim 1, wherein at least one of the stress testing sequences is updated dynamically within a sort testing stage.

17. The method according to claim 16, wherein at least one of the quality or reliability fail candidate populations is updated dynamically.

18. The method according to claim 17, wherein the dynamic update is based on data fed forward from historical information.

19. The method according to claim 18, wherein the historical information includes previously gathered and processed data of at least one of shifts or failure signatures in wafer Fab parametric E-Test.

20. The method according to claim 19, further comprising: backward analyzing data processed in the sort testing stage, and in response thereto, dynamically updating the at least one of the quality or reliability fail candidate populations.

21. The method according to claim 20 wherein the backward analyzing includes identifying at least one outlier unit and including the at least one outlier unit in at least one quality or reliability fail candidate population.

22. The method according to claim 21, further comprising associating a modified test flow to a quality or reliability fail candidate population that includes the at least one outlier unit, and applying, within the sort testing stage, the modified test flow sequence to at least one of the quality or reliability fail candidate populations for identifying at least one outlier unit which failed the test.

23. The method according to claim 18, wherein the historical information includes previously gathered and processed data of shifts or failure signatures in wafer Fab Particle signatures.

24. The method according to claim 18, wherein the historical information includes previously gathered and processed data of shifts or failure signatures in a given socket repair at a given stage.

25. The method according to claim 18, wherein the historical information includes previously gathered and processed data of semiconductor units with high redundancy repair features built-in.

26. The method according to claim 18, wherein the historical information included previously gathered and processed data of a shift in a process window parameter can go out of statistical control.

27. The method according to claim 1, wherein the stress testing sequence for at least one of the other population is updated dynamically within the sort testing stage.

28. A method for augmenting quality or reliability of semiconductor units, comprising:
  (a) providing at least two populations of semiconductor units that are subject to quality or reliability testing;
  (b) associating test flows that include stress testing sequences to the at least two populations; a first flow from the test flows further including an identical first pre-stress testing sequence and first post-stress testing sequence; a second flow from the test flows further including an identical second pre-stress testing sequence and a second post-stress testing sequence; the first and the second stress testing sequences being different; and
  (c) applying, within a sort testing stage:

the test flow that included the first pre-stress testing sequence, the stress testing sequence, and the first post-stress testing sequence, to at least one of the at least two populations; and the test flow that included the second pre-stress testing sequence, the stress testing sequence, and the second post-stress testing sequence, to at least one other of the at least two populations; for identifying any semiconductor unit which failed the first or second post-stress testing sequence.

29. The method according to claim 28, wherein the first and second flows are identical.

30. The method according to claim 28, wherein at least two stress testing sequences for the at least two populations are different.

31. The method according to claim 28, wherein the first flow further includes an additional pre-stress testing sequence and an additional post-stress testing sequence.

32. A method for augmenting quality or reliability of semiconductor units, comprising:
(a) providing at least two populations of semiconductor units that are subject to quality or reliability testing; the at least two populations including at least one quality or reliability fail candidate population and at least one other population;
(b) associating test flows to the at least two populations; each test flow including a stress testing sequence; the stress testing sequence for at least one of the quality or reliability fail candidate populations including a stress test of increased duration as compared to a duration of a stress test in a test flow of a population of at least one of the other populations; wherein the stress testing sequence for at least one of the other populations includes a stress test of increased voltage as compared to a corresponding operating voltage specification for the semiconductor unit;
(c) applying, within a final testing stage, a corresponding test flow to each of the at least two populations and identifying any semiconductor unit which failed the stress testing sequence.

33. A method for providing augmented quality or reliability tests configured to be applied to semiconductor units during a testing stage, comprising:
(a) analyzing data gathered from historical information that pertains to semiconductor units for identifying at least two populations of semiconductor units that are subject to quality or reliability testing; the at least two populations including at least one quality or reliability fail candidate population and at least one other population;
wherein at least one of the quality or reliability fail candidate populations includes a geographical area in a wafer that includes a cluster of at least two consecutive devices, such that any device in the cluster has at least one neighboring device which also belongs to the cluster; and
providing at least two different test flows and associating at least one of the at least two different test flows to one of the quality or reliability fail candidate populations, and at least one other test flow of the at least test flows to at least one of the other population; wherein the at least two different test flows are configured to be applied, within a testing stage, to the associated populations for identifying a semiconductor unit which has failed the test.

34. The method according to claim 33, wherein the geographical area in the wafer is in a form of a member in a group that includes a ring, slice, doughnut, and i o'clock where $1<i<12$.

35. The method according to claim 33, wherein the method is performed at a sort stage.

36. The method according to claim 33, wherein the method is performed at a final stage.

37. A method for providing augmented quality or reliability tests configured to be applied to semiconductor units during a testing stage, comprising:
(a) analyzing data gathered from historical information that pertain to semiconductor units for identifying at least two populations of semiconductor units that are subject to quality or reliability testing;
the at least two populations including at least one quality or reliability fail candidate population and at least one other population;
at least one of the quality or reliability fail candidate populations including semiconductor units with the same lithography exposure; and
(b) providing at least two different test flows and associating at least one of the at least two different test flows to one of the quality or reliability fail candidate populations, and at least one other test flow of the at least test flows to at least one of the other population; wherein the at least two different test flows are configured to be applied, within a testing stage, to the associated populations, for identifying a semiconductor unit which has failed the test.

38. The method according to claim 37, wherein the method is performed at a sort stage.

39. The method according to claim 37, wherein the method is performed at a final stage.

40. A method for providing augmented quality or reliability tests configured to be applied to semiconductor units during a testing stage, comprising:
(a) analyzing data gathered from historical information that pertain to semiconductor units for identifying at least two populations of semiconductor units that are subject to quality or reliability testing;
the at least two populations including at least one quality or reliability fail candidate population and at least one other population;
at least one of the quality or reliability fail candidate populations including semiconductor units with a same relative location across lithography exposures; and
(b) providing at least two different test flows and associating at least one of the at least two different test flows to at least one of the quality or reliability fail candidate populations, and associating at least one of an other different test flow to at least one of the other populations, the at least two different test flows being configured to be applied, within a testing stage, to associated populations for identifying a failed semiconductor unit.

41. The method according to claim 40, wherein the method is performed at a sort stage.

42. The method according to claim 36, wherein the repertoire of test flows includes a stress test with increased voltage as compared to a corresponding operating voltage specification for a semiconductor unit of the semiconductor units.

43. The method according to claim 40, wherein the method is performed at a final stage.

44. A method for providing augmented quality or reliability tests configured to be applied to semiconductor units during a manufacturing stage, comprising:

(a) analyzing data gathered from historical information that pertains to semiconductor units for identifying at least two populations of semiconductor units that are subject to quality or reliability testing; the at least two populations including at least one quality or reliability fail candidate population and at least one other population;

(b) providing a repertoire of test flows;

(c) for at least one of the quality or reliability fail candidate populations performing the following, including:

i) providing a reference burn-in units fail score in respect to the quality or reliability fail candidate population of a semiconductor sample;

ii) selecting a test flow from the repertoire of test flows;

iii) applying the selected test flow to the semiconductor sample of the quality or reliability fail candidate population and logging the tested unit's-fail score; the semiconductor sample being substantially identical to the semiconductor sample of (c) and (i);

iv) applying a burn-in test to the quality or reliability fail candidate population of the semiconductor sample of (iii) and logging the tested burn-in units fail score; wherein units having failed in the tested units fail score are excluded from the burn-in units fail score;

v) repeating at least once (ii) to (iv), in respect to different test flow from the repertoire of test flows;

vi) determining a prevailing test flow from among the test flows used in (ii), (iii) and (iv), according to a decision criterion; wherein the decision criterion is dependent at least on the reference burn-in units fail score, and the tested units fail score and tested burn-in units fail score of the prevailing test flow; and associating the prevailing test flow to the quality or reliability fail candidate population, for applying to semiconductor units during a manufacturing stage.

45. The method according to claim 44, wherein the decision criterion stipulates that the tested burn-in units fail score of the prevailing test flow is lowest as compared to the burn-in units fail scores of the other test flows used in (ii), (iii) and (iv) and that the tested burn-in units fail score is lower than the reference burn-in units fail score.

46. The method according to claim 44, wherein the semiconductor sample is at least one wafer of a lot and the substantially identical semiconductor sample is at least one other wafer from the lot.

47. The method according to claim 44, wherein the repertoire of test flows includes a stress test of increased duration as compared to a duration of a stress test in the test flow of at least one of the other populations.

48. The method according to claim 47, wherein the semiconductor device is a memory device and wherein the stress test of increased duration consists of a larger number of test cycles to be applied to the semiconductor device as compared to a number of test cycles of a stress test for the at least one other population.

49. The method according to claim 44, wherein the repertoire of test flows includes a stress test operable under a different temperature as compared to a corresponding operating temperature specification for a semiconductor unit of the semiconductor units.

50. The method according to claim 44, wherein the repertoire of test flows includes a stress test operable under a different frequency as compared to a corresponding operating frequency specification for a semiconductor unit of the semiconductor units.

51. A method for providing augmented quality or reliability tests configured to be applied to semiconductor units during sort stage, comprising:

(a) analyzing data gathered from historical information that pertains to semiconductor units for identifying at least one populations of semiconductor units that is subject to quality or reliability testing;

(b) associating a respective selected test flow to each one of the at least one populations according to a decision criterion that includes a condition that a fail rate of units in a burn-in test that follows the selected test flow is lower than a fail rate of units in a burn-in test that follows a non-selected test flow.

52. A system for augmenting quality or reliability of semiconductor units, comprising:

means including a processor and storage configured to provide at least two populations of semiconductor units that are subject to quality or reliability testing; the at least two populations including at least one quality or reliability fail candidate population and at least one other population;

means including a processor and storage configured to associate test flows to the at least two populations; each test flow including a stress testing sequence;

wherein the stress testing sequence for at least one of said the quality or reliability fail candidate populations includes a stress test of increased duration as compared to a duration of a stress test in the test flow of at least one of the other populations;

wherein the stress testing sequence for at least one of the other populations includes a stress test of increased voltage as compared to a corresponding operating voltage specification for a semiconductor unit of the semiconductor units; and means configured to apply, within a testing stage, the corresponding test flow to each population and identifying any semiconductor unit which failed the stress testing sequence.

53. The system according to claim 52, wherein the testing stage is within a sort stage.

54. The system according to claim 52, wherein the testing stage is within a final stage.

55. The system according to claim 52, wherein said means including a processor and storage further includes, a data manager coupled to a plurality of data storages, and wherein the means configured to apply further includes, a station controller associated with the plurality of data storages, wherein the station controller is associated with handling equipment and with automatic test equipment.

56. A system for augmenting quality or reliability of semiconductor units, comprising:

means including a processor and storage configured to provide at least two populations of semiconductor units that are subject to quality or reliability testing;

means including a processor and storage configured to associate test flows that include stress testing sequences to the at least two populations; a first test flow from among the test flows further including an identical first pre-stress testing sequence and first post-stress testing sequence; a second test flow from the test flows further including an identical second pre-stress testing sequence and second post-stress testing sequence; wherein the first and second stress testing sequences are different; and means configured to apply, within a testing stage, a test flow that includes the first pre-stress testing sequence, the first stress testing sequence and the first post-stress testing sequence, and a test flow that includes the second pre-stress testing sequence, the second stress testing sequence and the second post-stress testing sequence, to at least one of the at least two populations for identifying any semiconductor unit which failed the first or second post-stress testing sequence.

57. The system according to claim 56, wherein the testing stage is within a sort stage.

58. The system according to claim 56, wherein the testing stage within a final stage.

59. The system according to claim 56, wherein the means including a processor and storage further includes, a data manager coupled to a plurality of data storages, and wherein the means configured for applying further includes, a station controller associated with the plurality of data storages, wherein the station controller is associated with handling equipment and with automatic test equipment.

60. A computer program product containing a computer readable medium having instructions encoded therein for operation of a computing device, comprising:

instructions for performing at least one of storing or reading storage data indicative of at least two populations of semiconductor units that are subject to quality or reliability testing, wherein the at least two populations include at least one quality or reliability fail candidate population and at least one other population;

instructions for performing at least one of storing or reading test flow information associated with the at least two populations of semiconductor units, wherein the test flow information contains a stress testing sequence, wherein the test stressing sequence for at least one of the quality or reliability fail candidate populations includes a stress test of increased duration as compared to a duration of a stress test in one of the other populations, the stress testing sequence for at least one of the other population including a stress test of increased voltage as compared to a corresponding operating voltage specification for a semiconductor unit of the semiconductor units; and instructions for applying within a testing stage, an association of a corresponding test flow to each of the at least two populations, to enable an identification of a failing semiconductor unit.

61. A computer program product containing a computer readable medium having instructions encoded therein for operation of a computing device, comprising:

instructions for performing at least one of storing or reading storage data indicative of at least two populations of semiconductor units that are subject to quality or reliability testing, wherein the at least two populations include at least one quality or reliability fail candidate population and at least one other population;

instructions for performing at least one of storing or reading test flow data associated with the at least two populations of semiconductor units, wherein the test flow data includes stress test sequences to the at least two populations, wherein a first test flow from the test flow data includes an identical first pre-stress test sequence and a first post-stress test sequence, and a second test flow from the test flow data includes a second pre-stress test sequence and a second post-stress test sequence, the sequences of the first and second test flow data being different; and instructions to apply, within a testing stage, test flow that include a pre-stress test sequence, an associated stress test sequence, and a post-stress test sequence to at least one of an associated population, to enable an identification of a semiconductor unit that failed the post-stress test sequence.

* * * * *

UNITED STATES PATENT AND TRADEMARK OFFICE
CERTIFICATE OF CORRECTION

PATENT NO. : 7,340,359 B2  Page 1 of 1
APPLICATION NO. : 11/343209
DATED : March 4, 2008
INVENTOR(S) : Erez et al.

It is certified that error appears in the above-identified patent and that said Letters Patent is hereby corrected as shown below:

Claim 33, Column 35, Line 59,
Please delete "providing at least two different test"
and
replace with
-- (b) providing at least two different test --

Claim 42, Column 36, Line 58,
Please delete "according to claim 36, wherein"
and
replace with
-- according to claim 41, wherein --

Signed and Sealed this

Twenty-first Day of October, 2008

JON W. DUDAS
*Director of the United States Patent and Trademark Office*